United States Patent
Hong et al.

(10) Patent No.: US 12,513,942 B2
(45) Date of Patent: Dec. 30, 2025

(54) VERTICAL-STRUCTURE FIELD-EFFECT TRANSISTOR AND MANUFACTURING METHOD THEREFOR

(71) Applicant: KOREA UNIVERSITY RESEARCH AND BUSINESS FOUNDATION, SEJONG CAMPUS, Sejong-si (KR)

(72) Inventors: Mon Pyo Hong, Seongnam-si (KR); Min Ki Ryu, Sejong-si (KR)

(73) Assignee: KOREA UNIVERSITY RESEARCH AND BUSINESS FOUNDATION, SEJONG CAMPUS, Sejong-si (KR)

( * ) Notice: Subject to any disclaimer, the term of this patent is extended or adjusted under 35 U.S.C. 154(b) by 494 days.

(21) Appl. No.: 17/964,528

(22) Filed: Oct. 12, 2022

(65) Prior Publication Data
US 2023/0042988 A1   Feb. 9, 2023

Related U.S. Application Data

(63) Continuation of application No. PCT/KR2021/004563, filed on Apr. 12, 2021.

(30) Foreign Application Priority Data

Apr. 13, 2020 (KR) .................. 10-2020-0044878
Apr. 12, 2021 (KR) .................. 10-2021-0047110

(51) Int. Cl.
H10D 30/67  (2025.01)
H10D 30/01  (2025.01)

(52) U.S. Cl.
CPC ....... *H10D 30/6728* (2025.01); *H10D 30/031* (2025.01); *H10D 30/6729* (2025.01)

(58) Field of Classification Search
CPC ............. H10D 30/6728; H10D 30/031; H10D 30/6729; H10D 30/6755; H10D 30/60;
(Continued)

(56) References Cited

U.S. PATENT DOCUMENTS

2004/0092068 A1   5/2004  Hsieh
2006/0049461 A1*  3/2006  Schuele ............... H10D 86/00
                                                438/149

FOREIGN PATENT DOCUMENTS

JP   09-232447 A    9/1997
JP   2006-032410 A  2/2006
(Continued)

OTHER PUBLICATIONS

Office Action issued Feb. 27, 2023 in Korean Application No. 10-2021-0047110.
(Continued)

*Primary Examiner* — Thanh T Nguyen
(74) *Attorney, Agent, or Firm* — Sughrue Mion, PLLC

(57) ABSTRACT

A vertical-structure field-effect transistor comprises: a gate electrode, which is formed on a substrate and has a horizontal plane extending in the planar direction and a vertical plane extending in the height direction; a gate insulating layer for covering the gate electrode; a vertical channel which is formed on the gate insulating layer and has a channel formed in the height direction; a source electrode formed to make contact with one end of the vertical channel; and a drain electrode formed to make contact with the other end of the vertical channel and formed at a height level different from that of the source electrode, wherein channel on/off of the vertical channel is controlled by means of an electric field formed from the vertical plane of the gate electrode to the vertical channel, and the source electrode and/or the drain electrode can be non-overlapping on the gate electrode in the height direction of the gate electrode.

2 Claims, 33 Drawing Sheets

(58) Field of Classification Search
CPC ........ H10D 62/13; H10D 62/17; H10D 64/27; H10D 84/0126; H10D 84/038
See application file for complete search history.

(56) References Cited

FOREIGN PATENT DOCUMENTS

| | | |
|---|---|---|
| JP | 2017-130691 A | 7/2017 |
| KR | 10-0136931 B1 | 4/1998 |
| KR | 10-0223754 B1 | 10/1999 |
| KR | 10-0261305 A | 7/2000 |
| KR | 10-2013-0011966 A | 1/2013 |
| KR | 10-2013-0039945 A | 4/2013 |
| KR | 10-2013-0074954 A | 7/2013 |
| KR | 10-1958769 B1 | 3/2019 |
| KR | 10-2020-0059016 A | 5/2020 |

OTHER PUBLICATIONS

International Search Report for PCT/KR2021/004563, dated Jul. 27, 2021.

\* cited by examiner

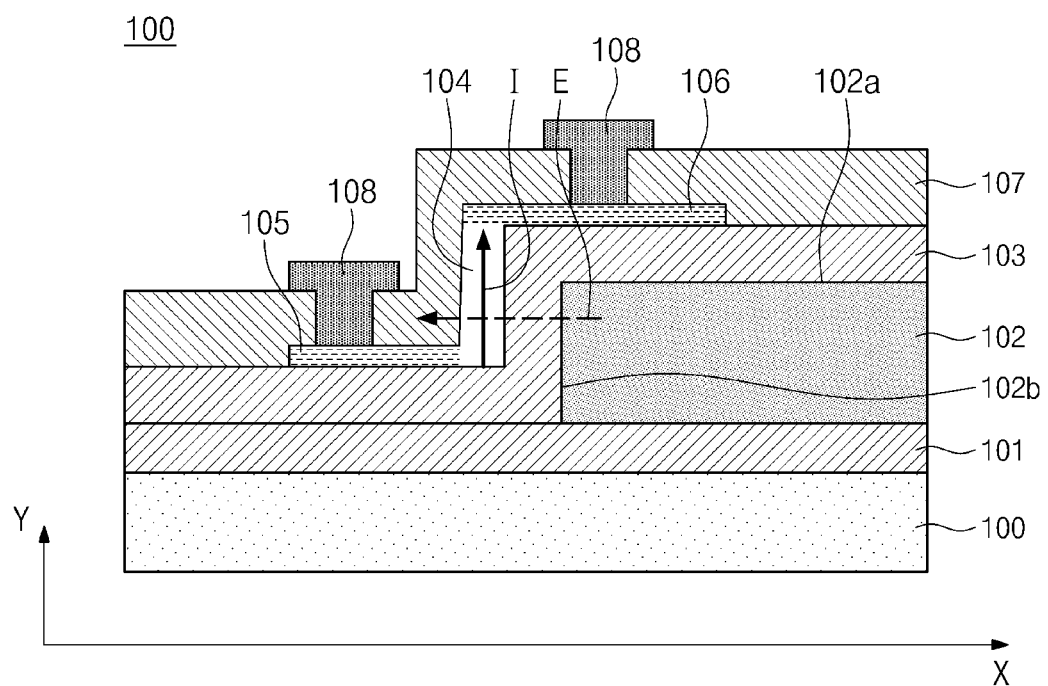
[FIG 1]

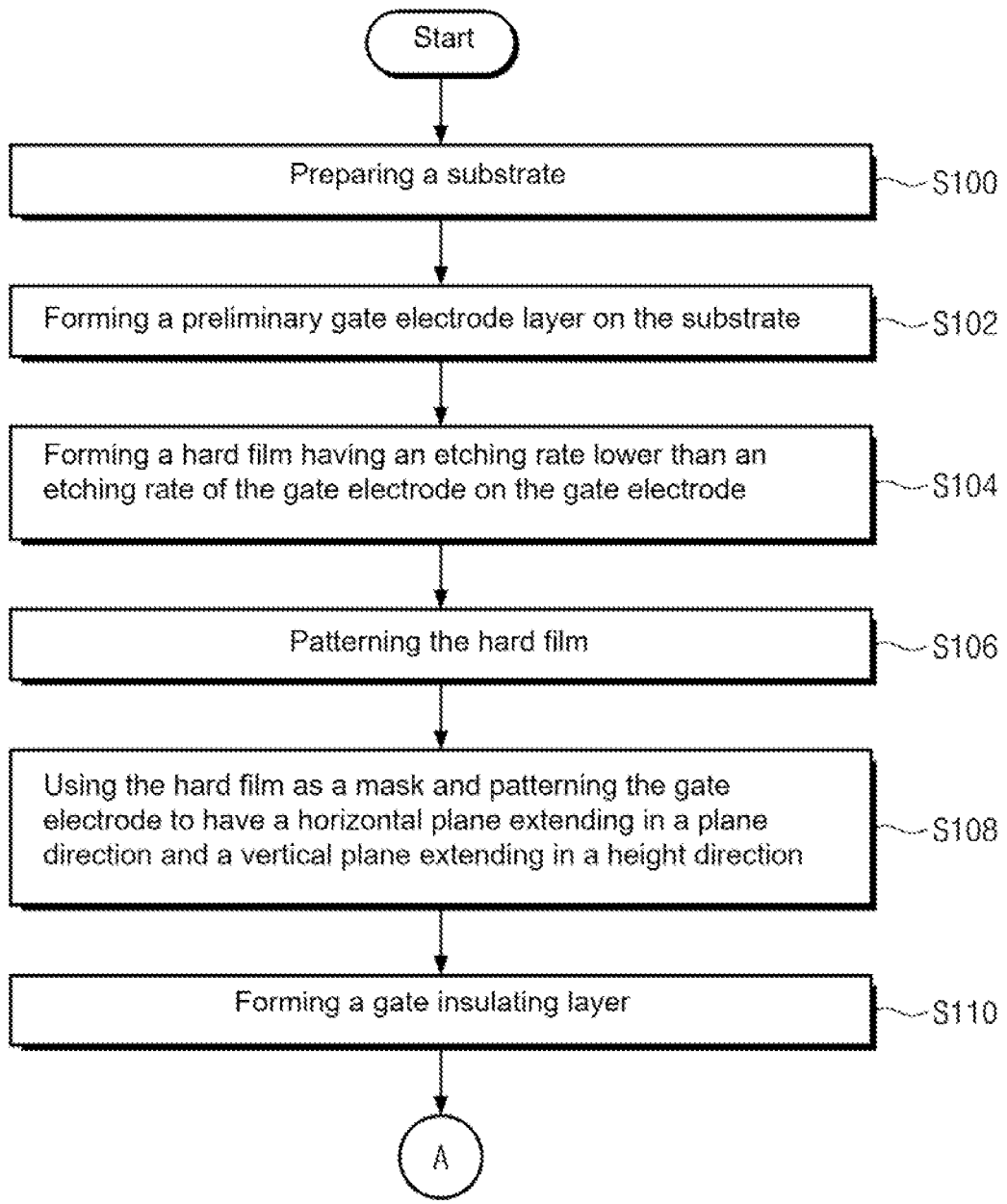
[FIG 2]

[FIG 3]
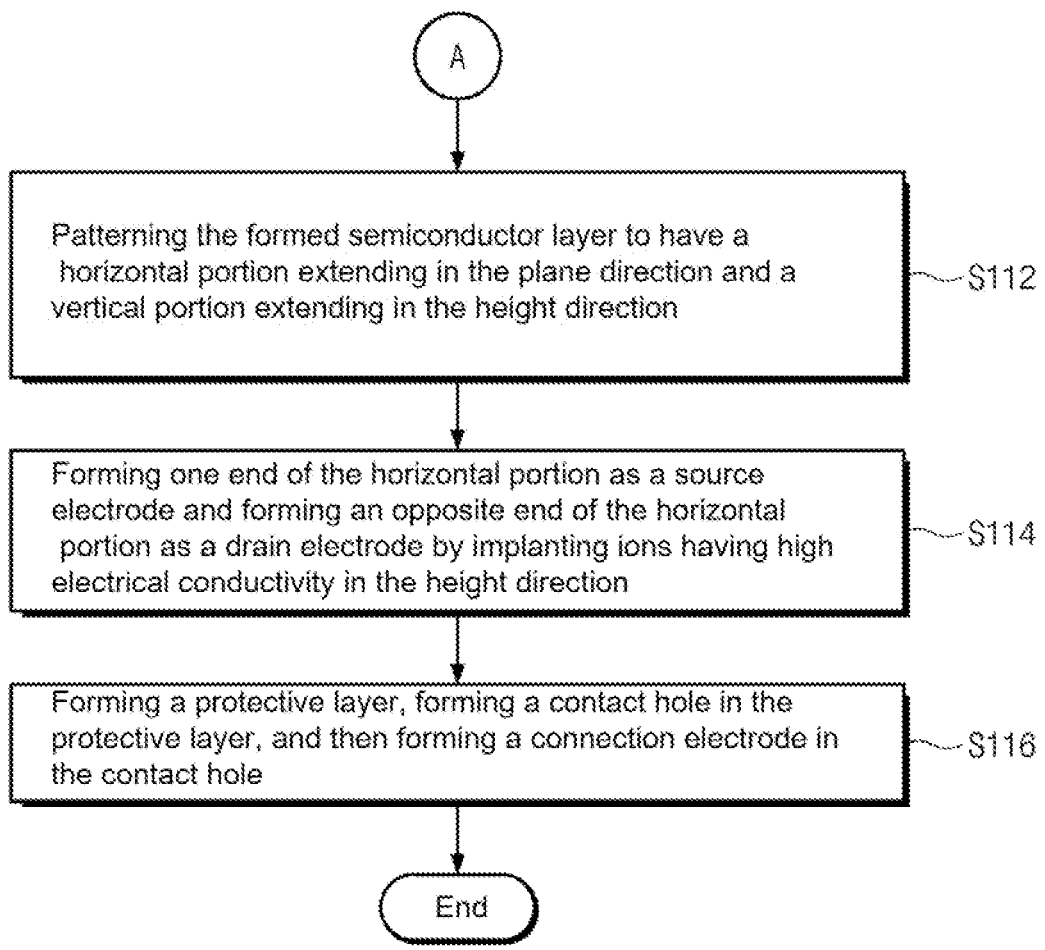

[FIG 4]
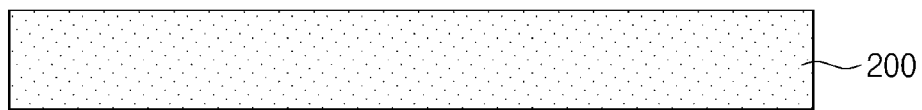
[FIG 5]
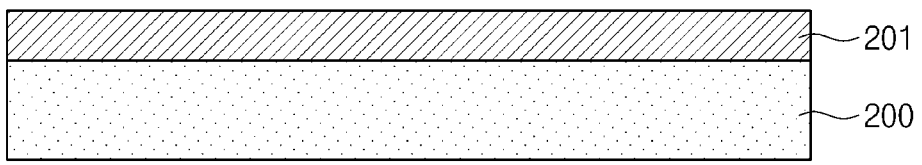
[FIG 6]
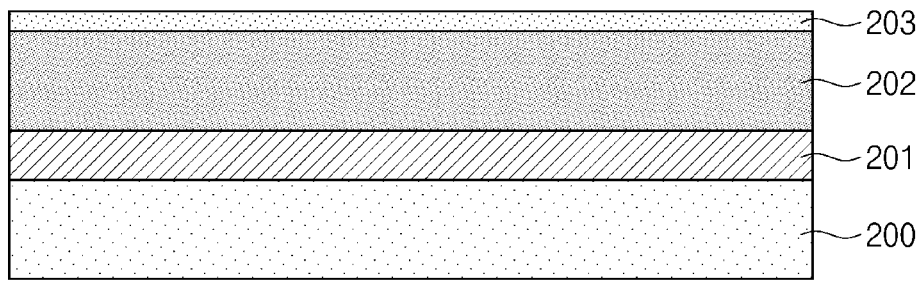

[FIG 7]
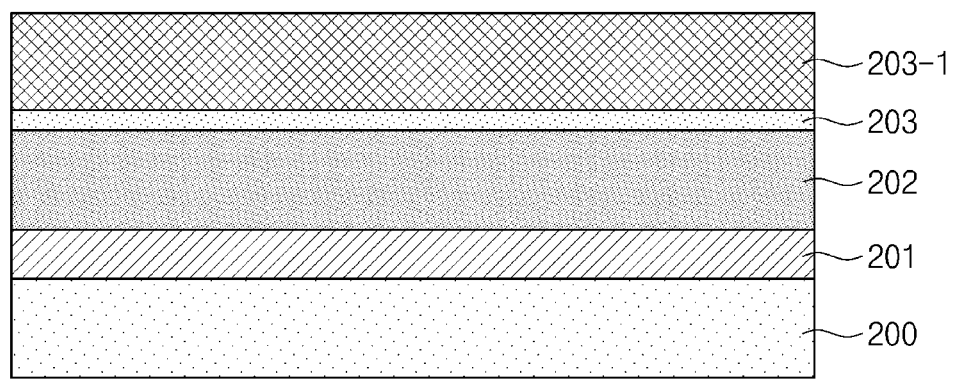
[FIG 8]
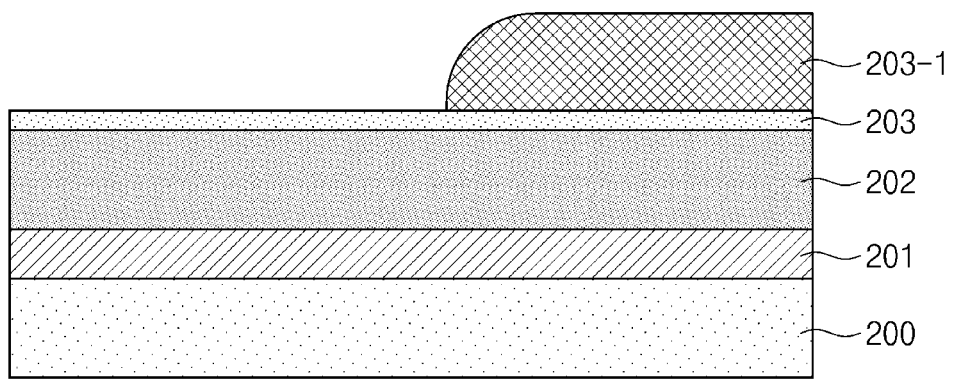

[FIG 9]
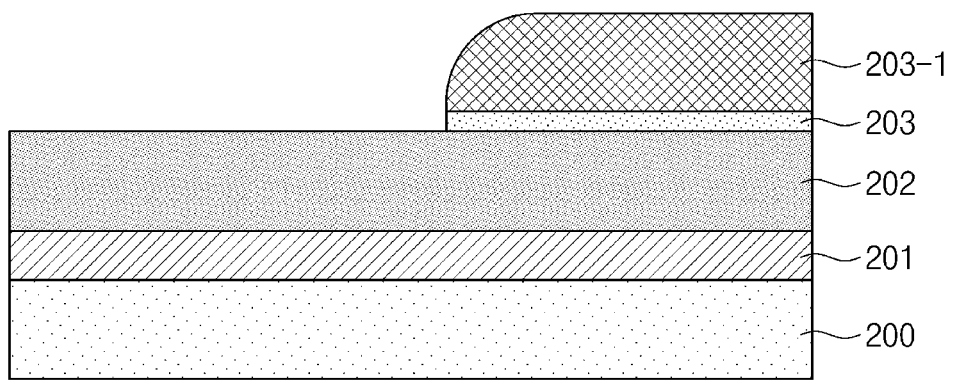
[FIG 10]
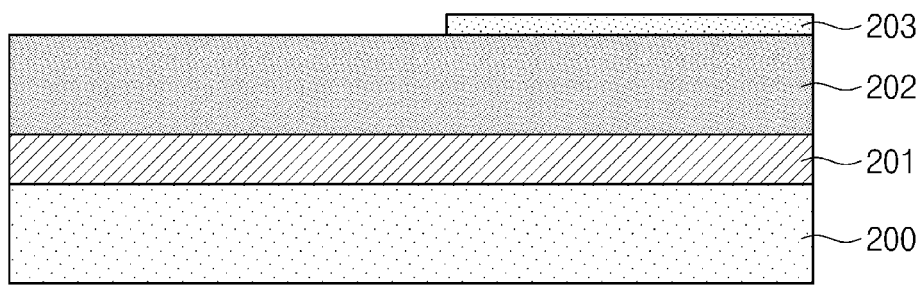

[FIG 11]
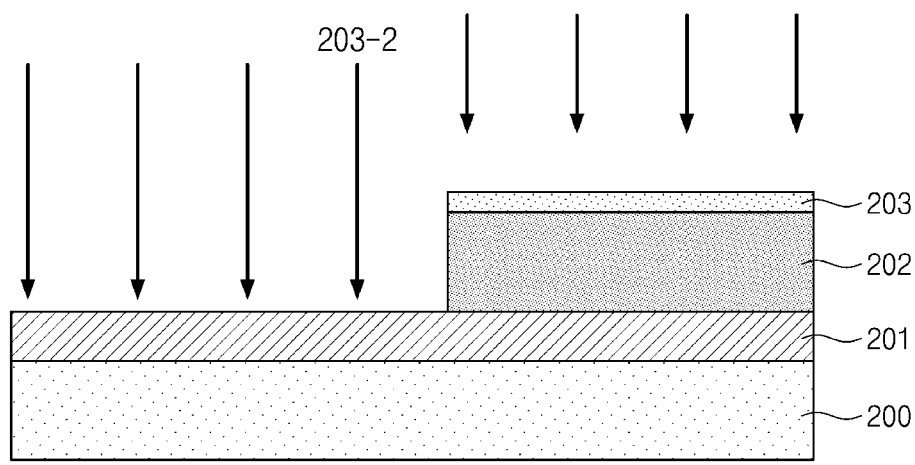
[FIG 12]
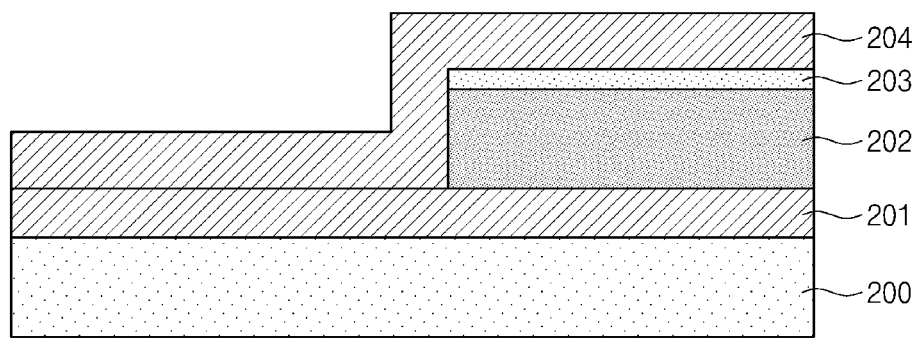

[FIG 13]
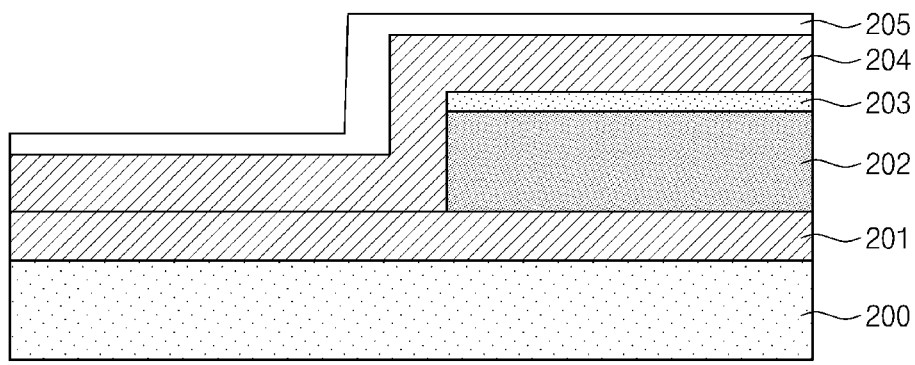
[FIG 14]
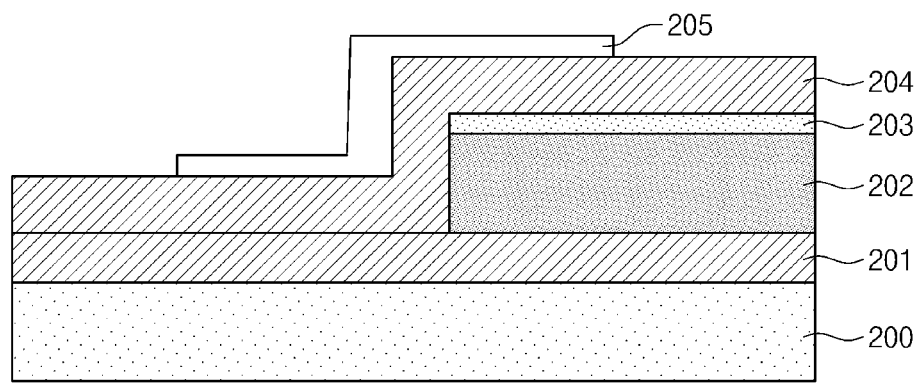

[FIG 15]
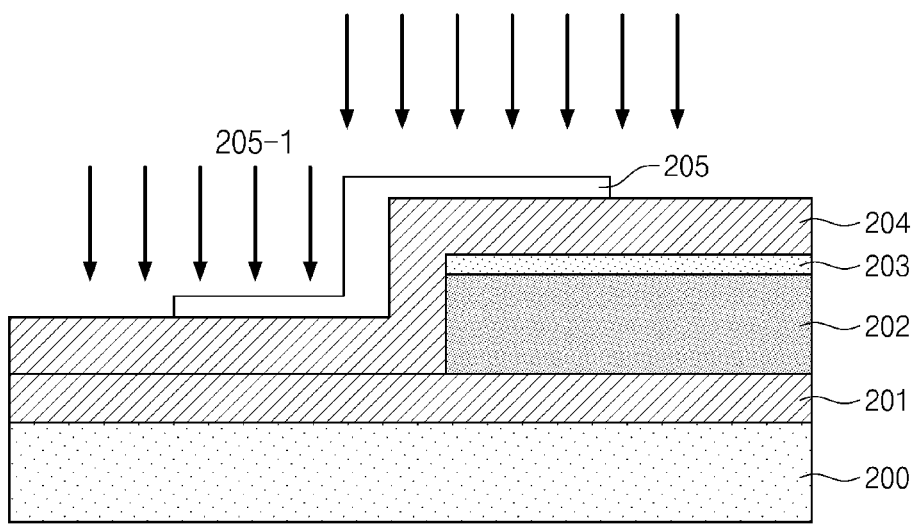
[FIG 16]
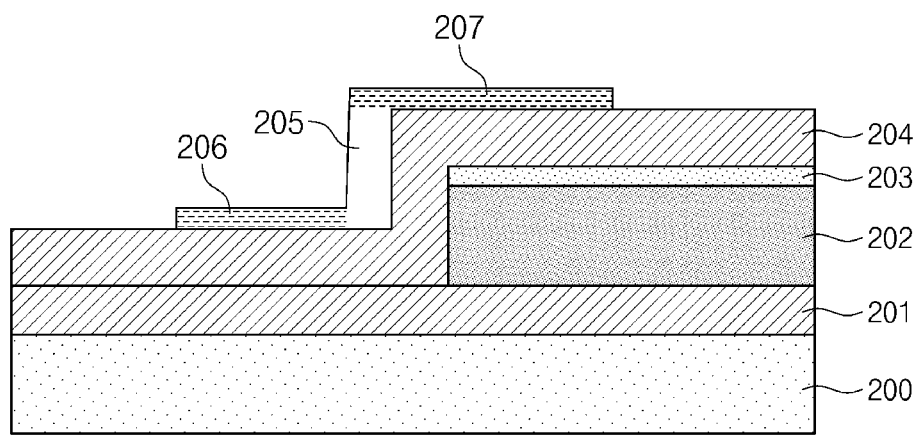

[FIG 17]
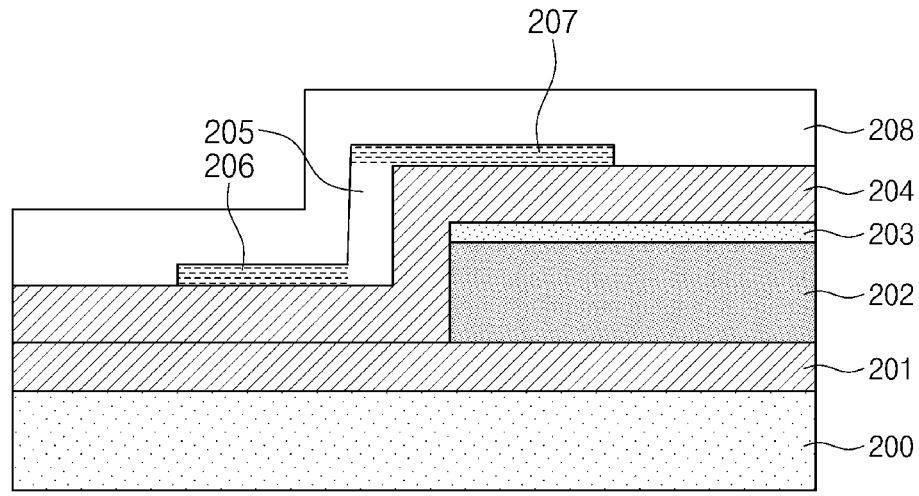
[FIG 18]
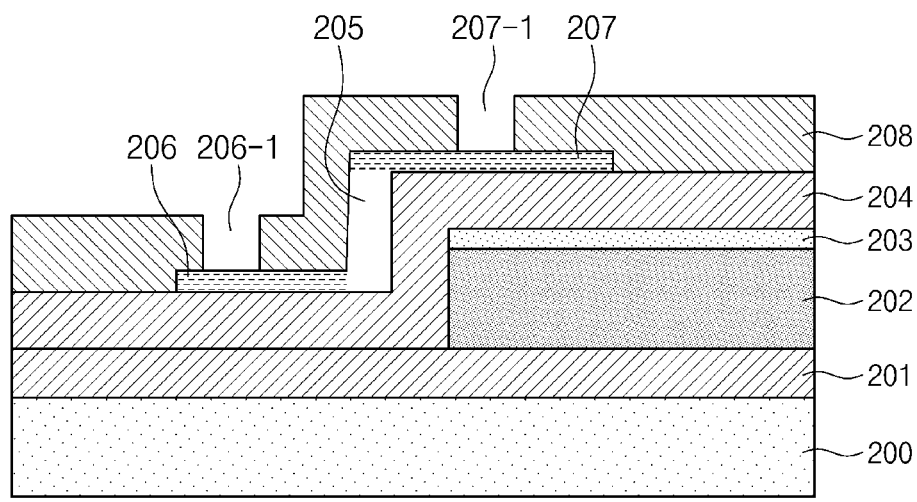

[FIG 19]
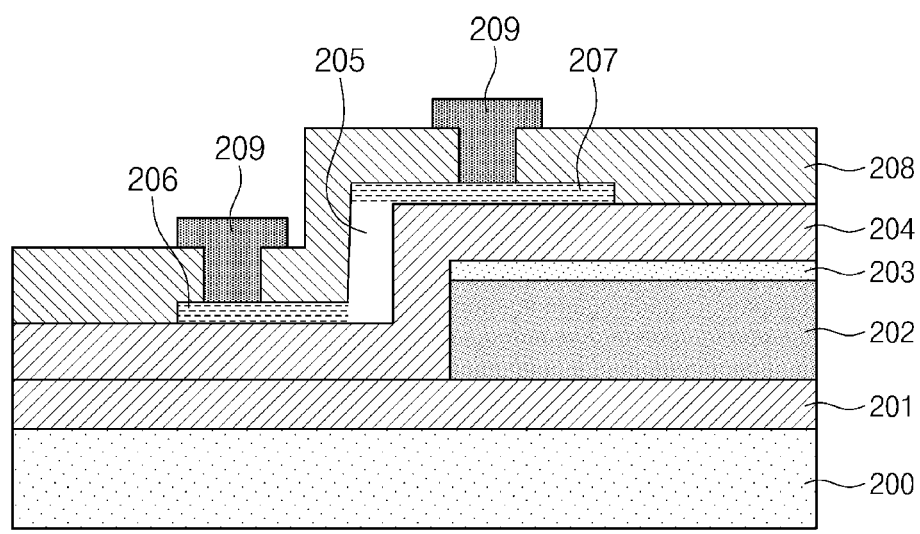

[FIG 20]
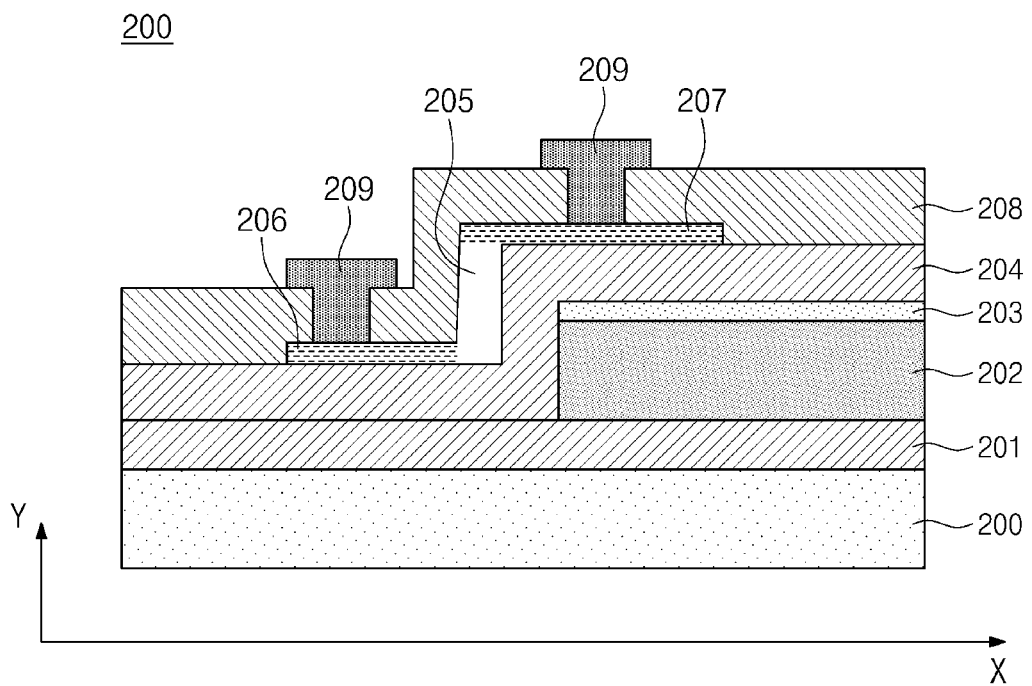

[FIG 21]
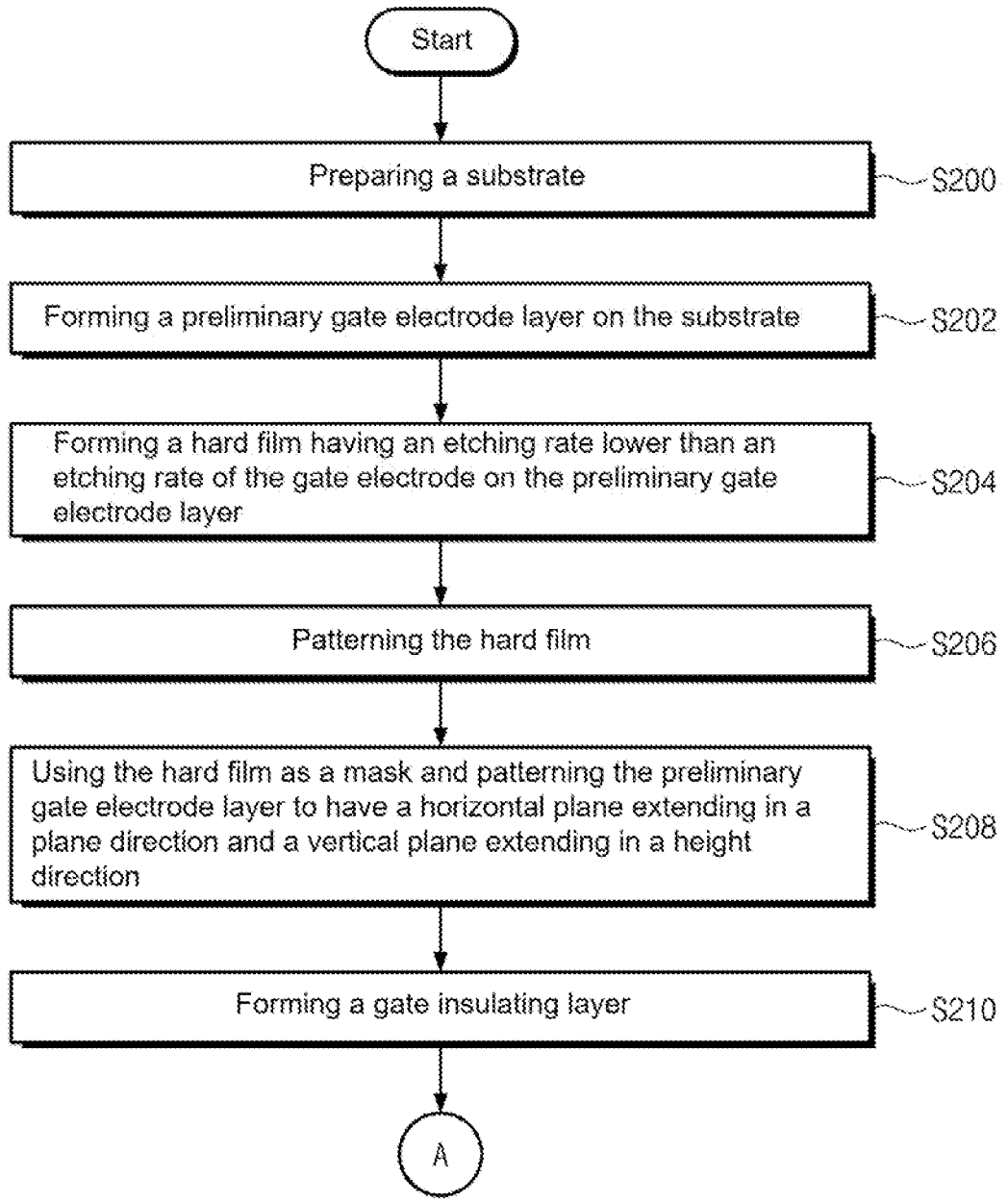

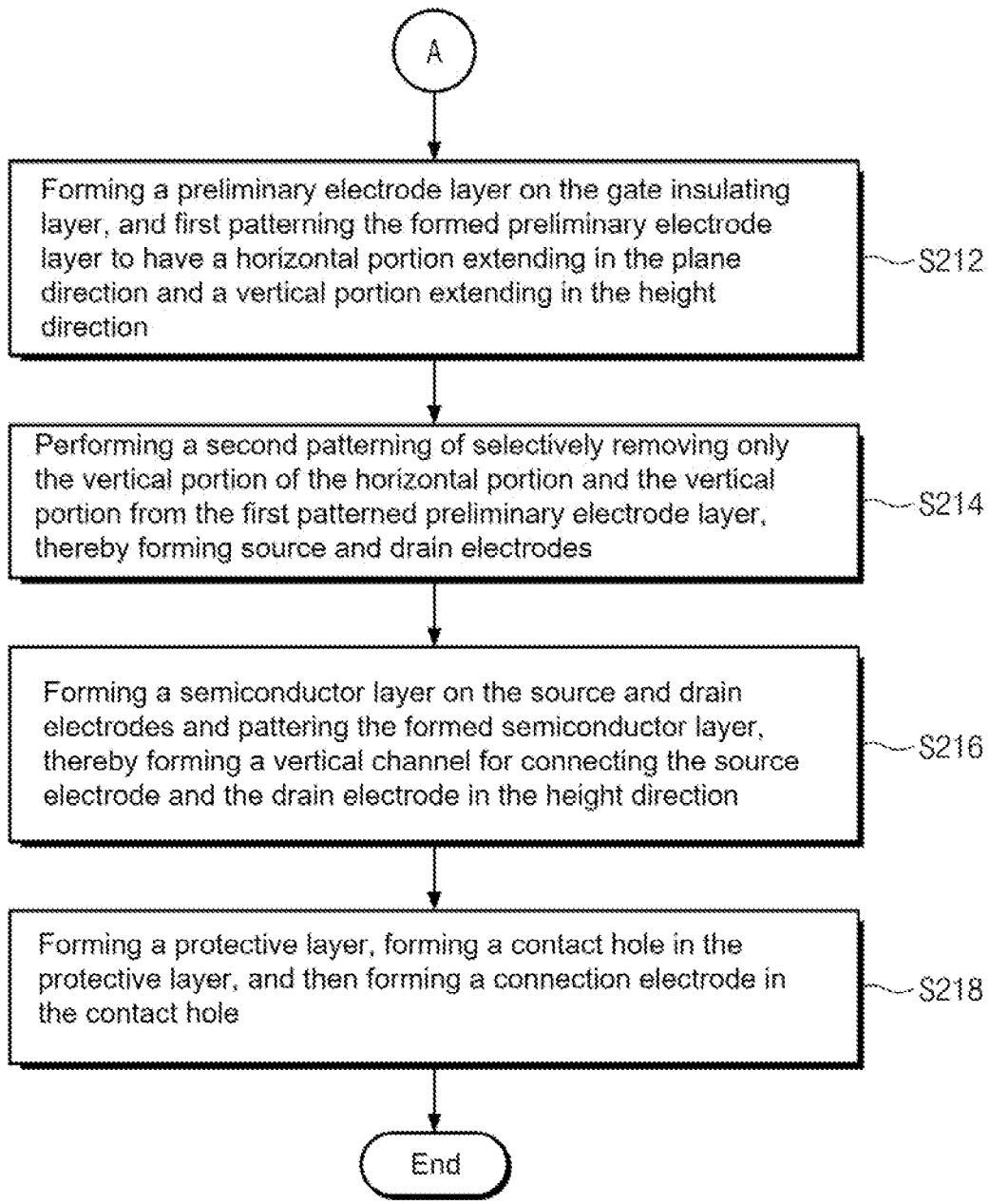
[FIG 22]

[FIG 23]
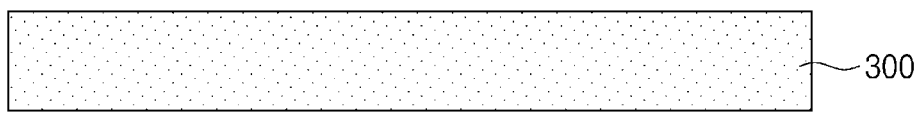
[FIG 24]
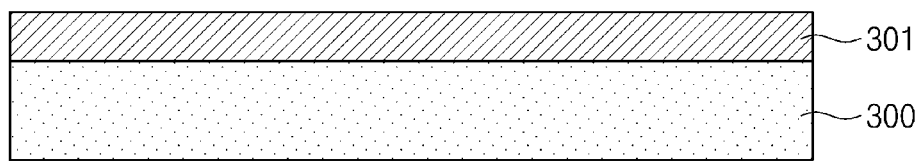
[FIG 25]
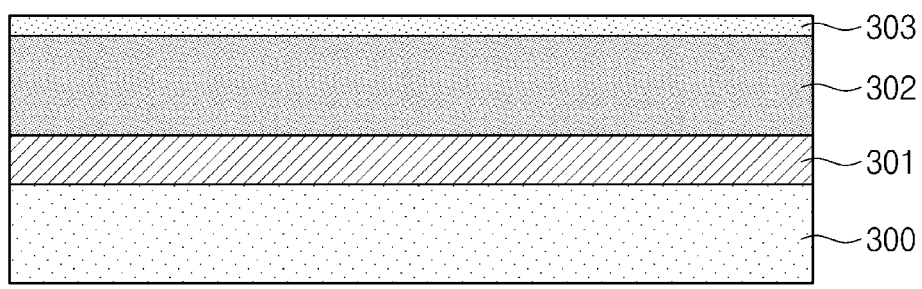

[FIG 26]
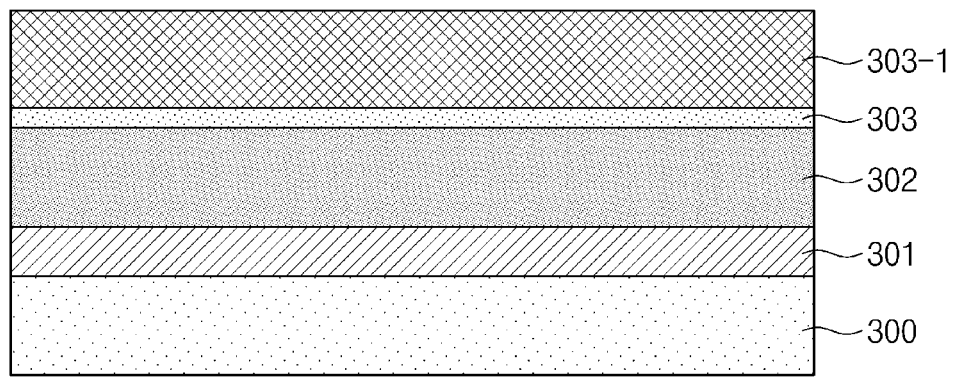
[FIG 27]
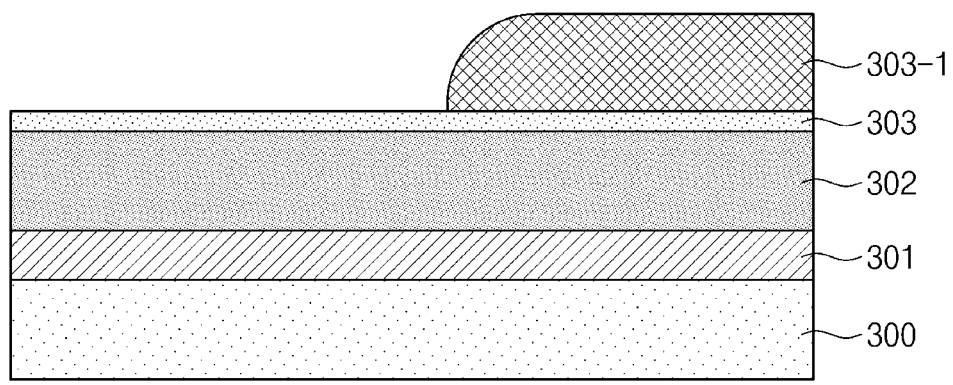

[FIG 28]
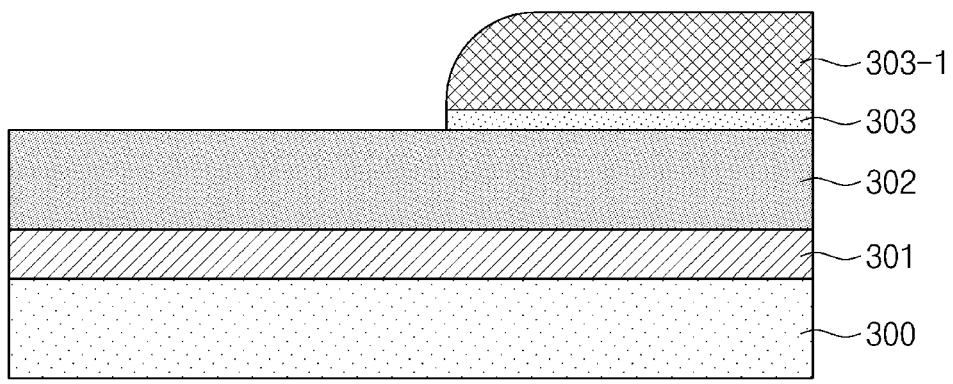
[FIG 29]
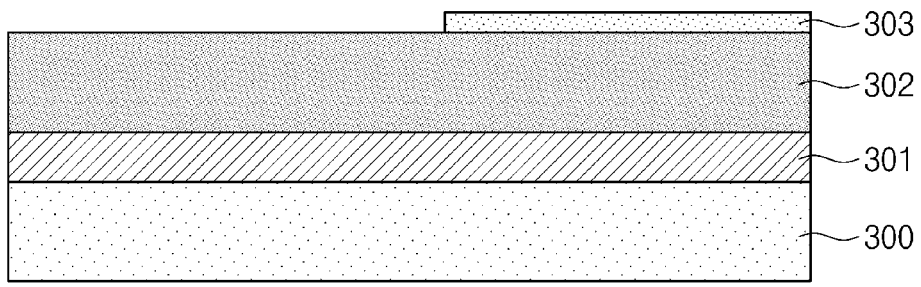

[FIG 30]
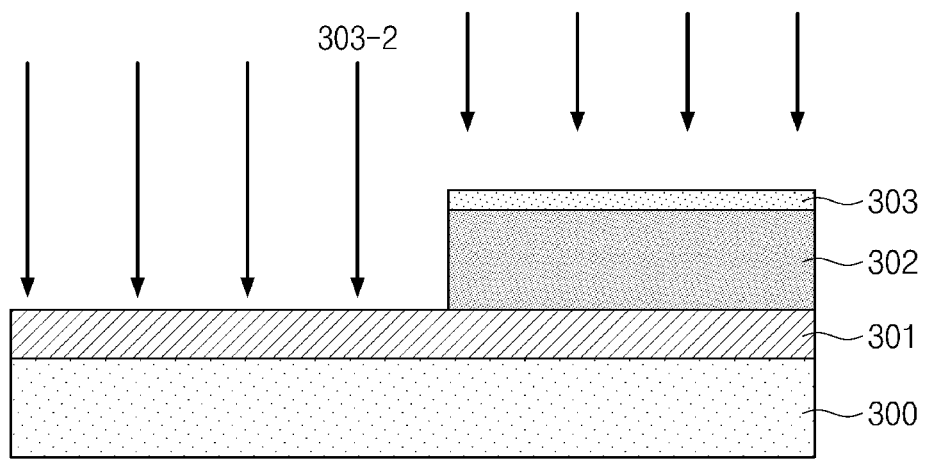
[FIG 31]
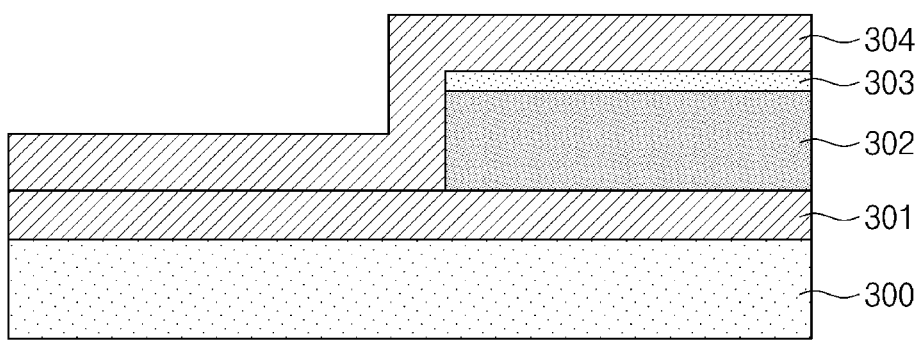

[FIG 32]
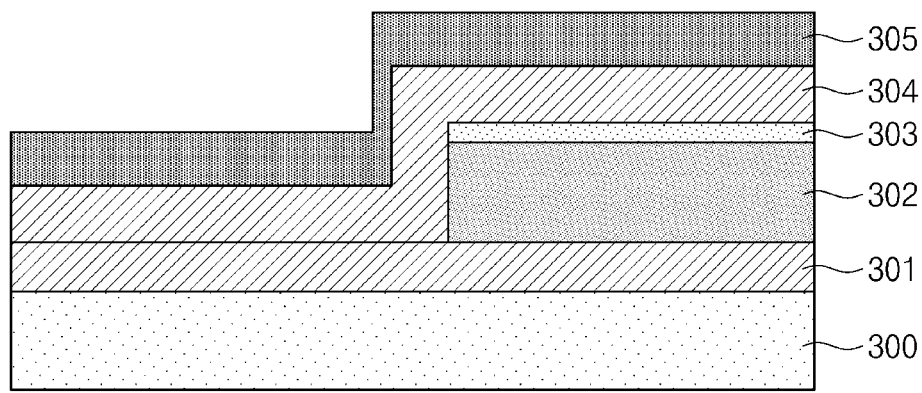
[FIG 33]
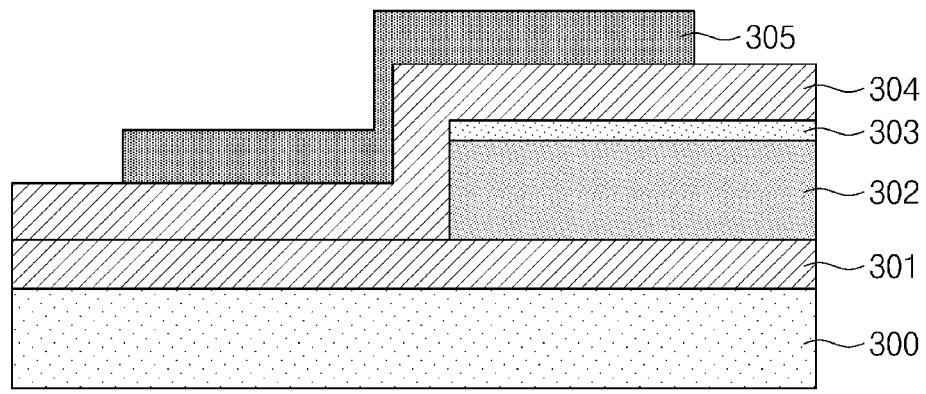

[FIG 34]
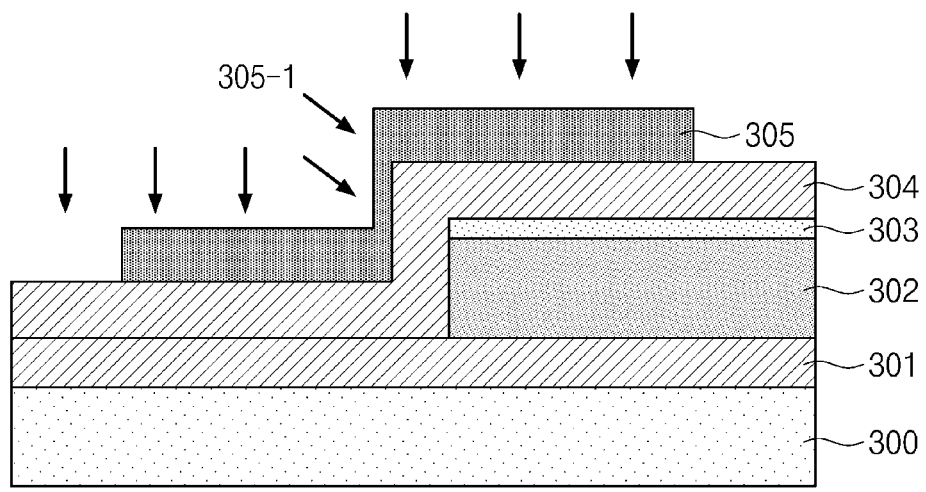
[FIG 35]
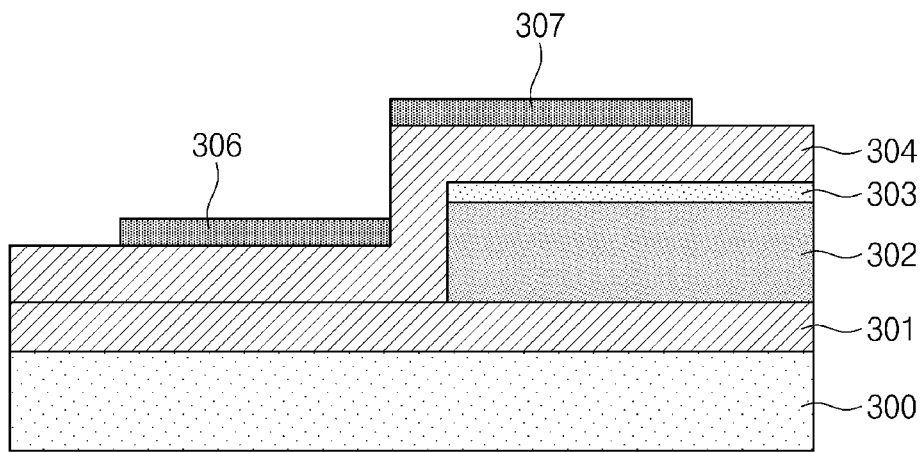

[FIG 36]
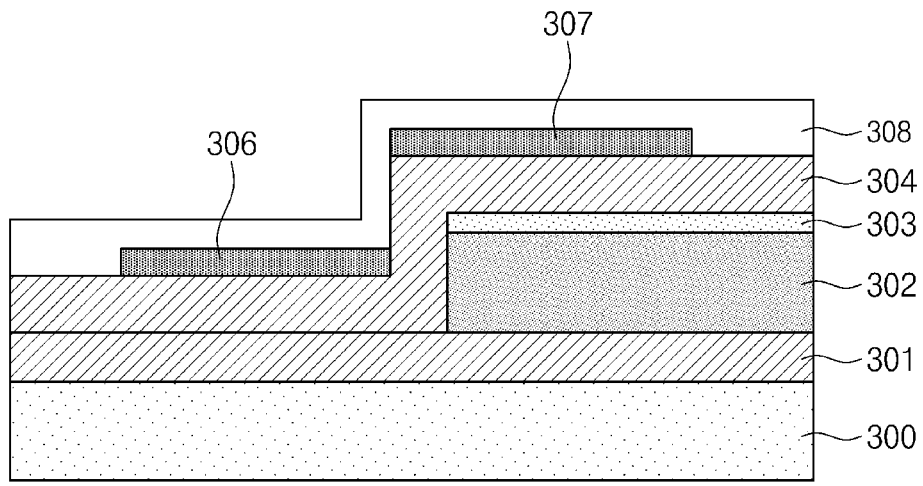
[FIG 37]
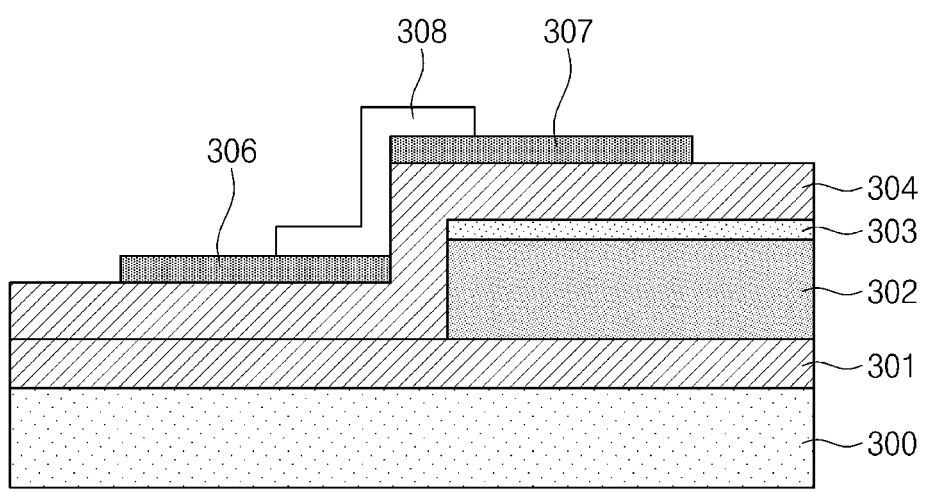

[FIG 38]
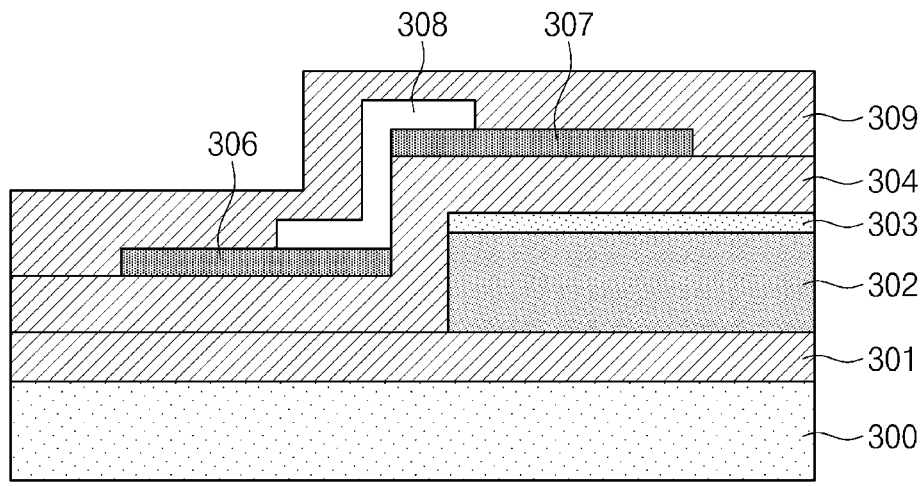
[FIG 39]
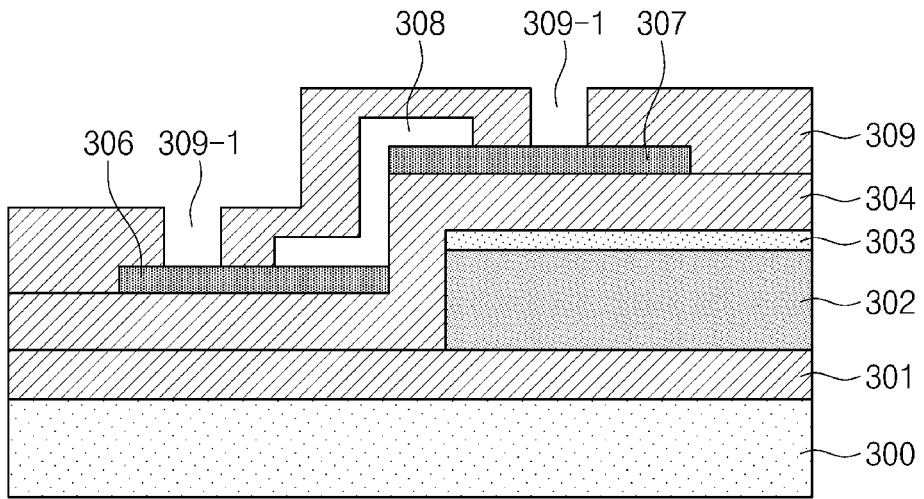

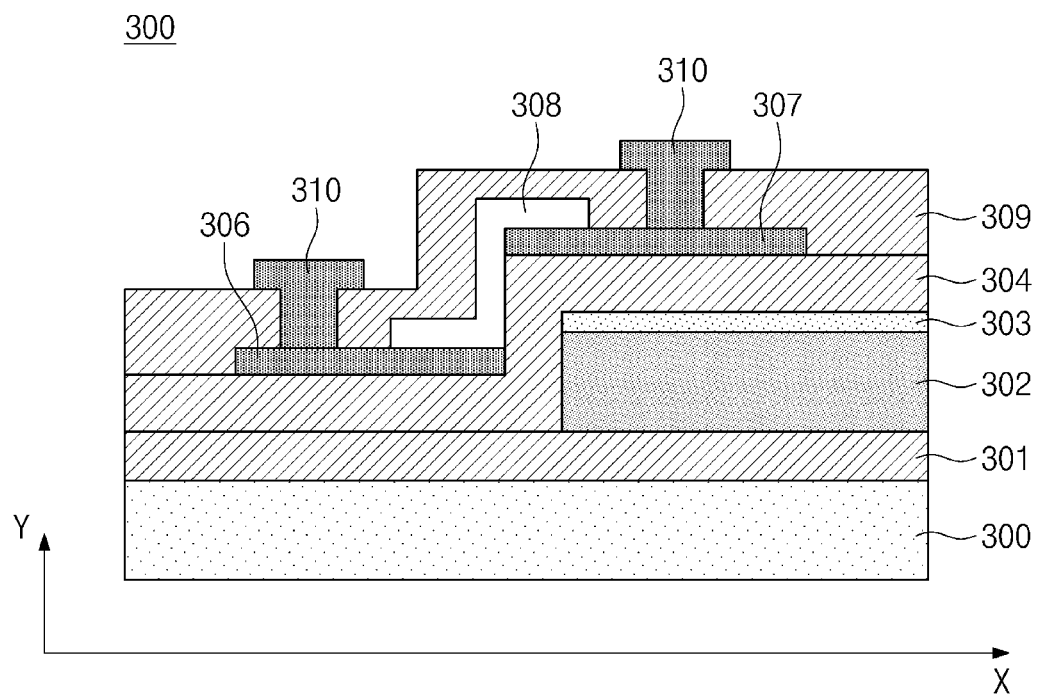
[FIG 40]

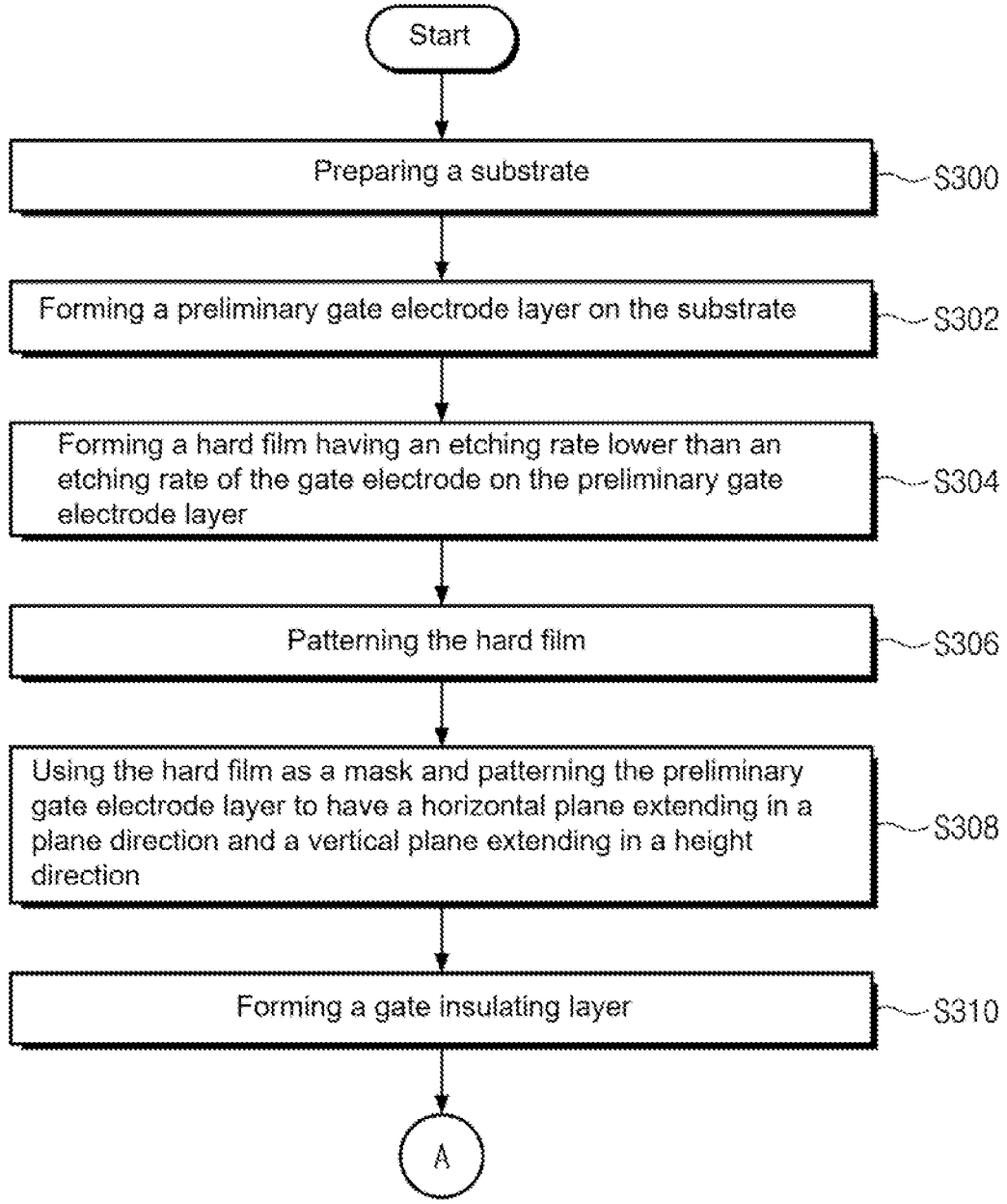

[FIG 42]
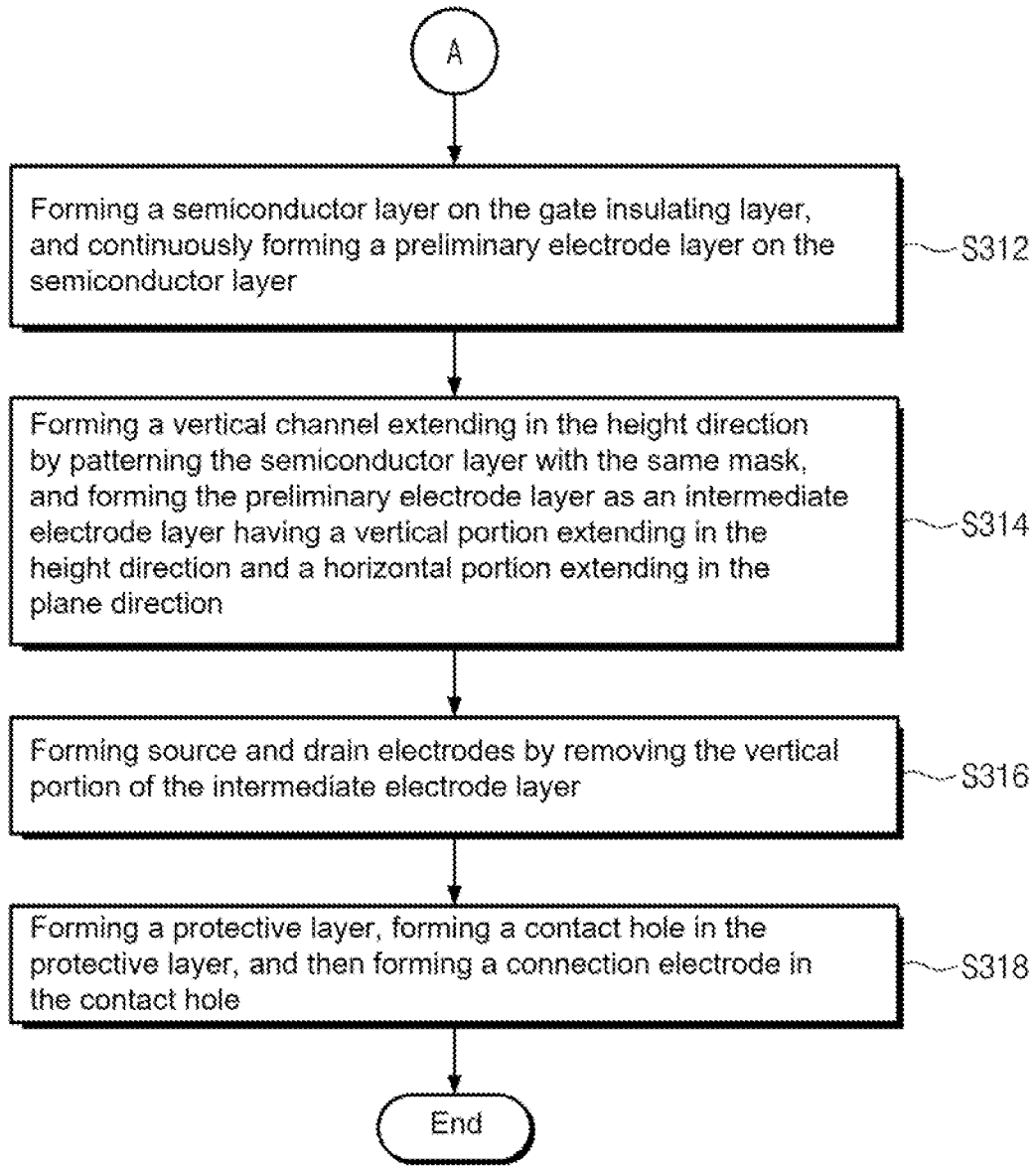

[FIG 43]
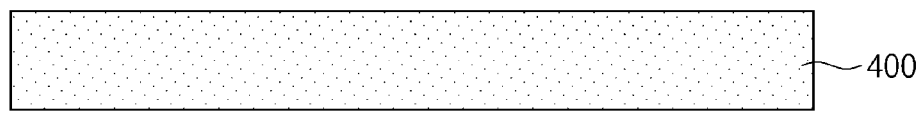
[FIG 44]
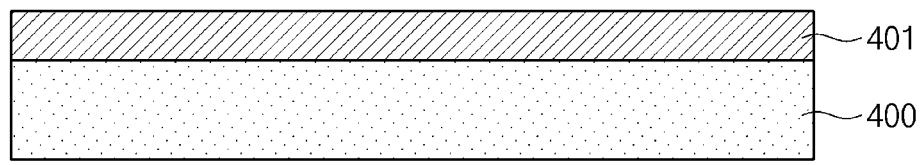
[FIG 45]
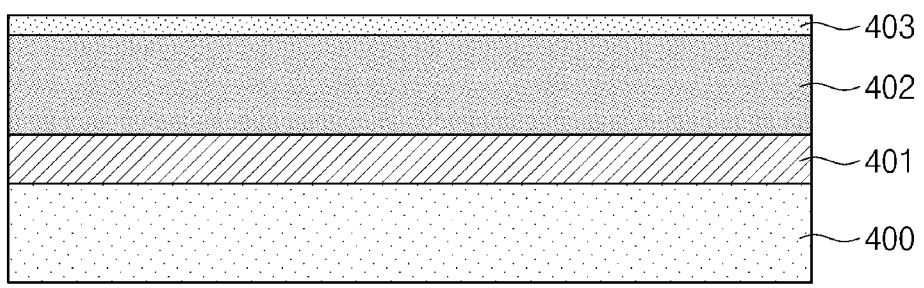

[FIG 46]
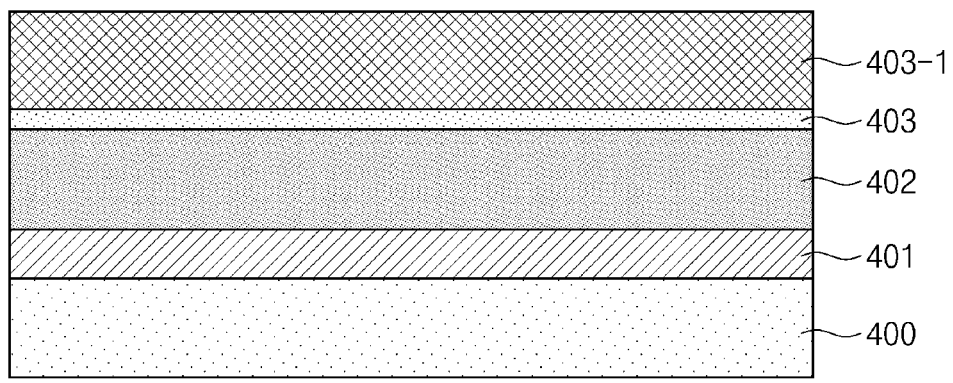
[FIG 47]
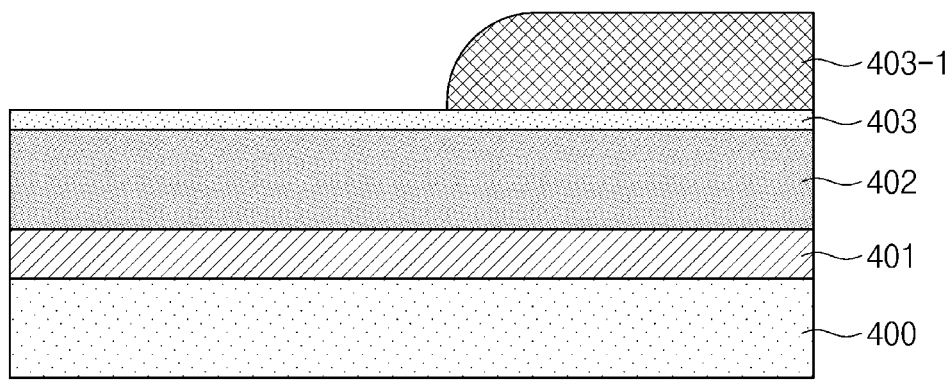

[FIG 48]
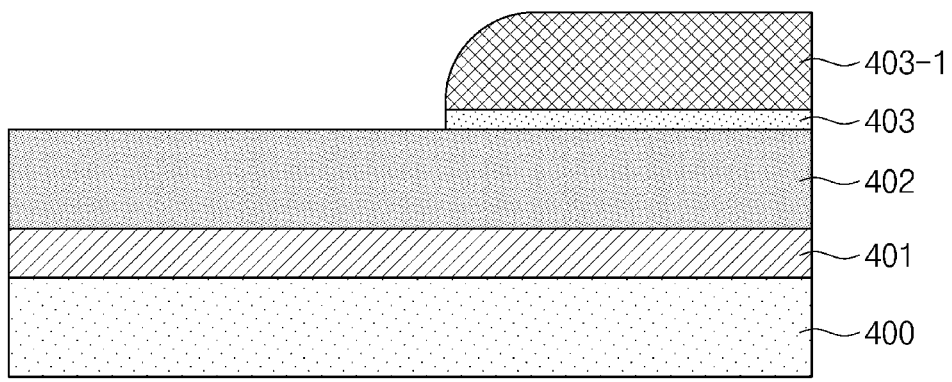
[FIG 49]
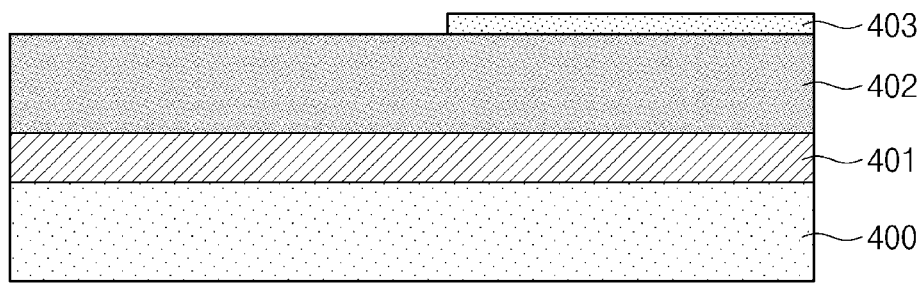

[FIG 50]
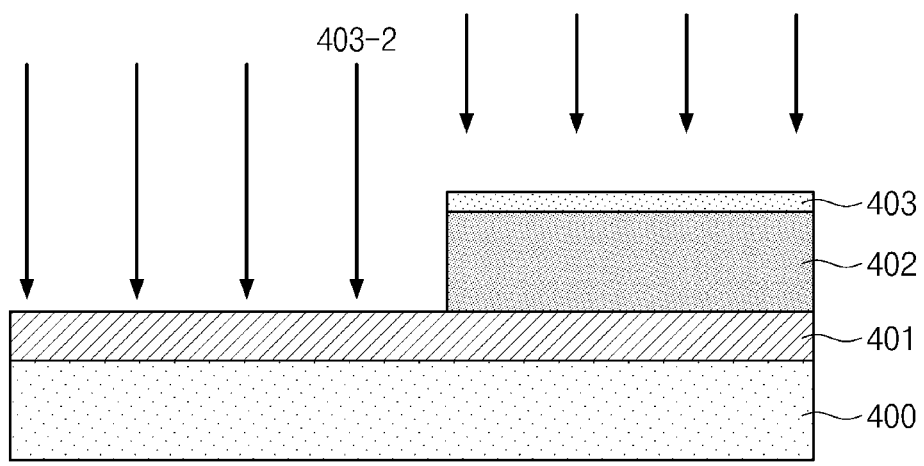
[FIG 51]
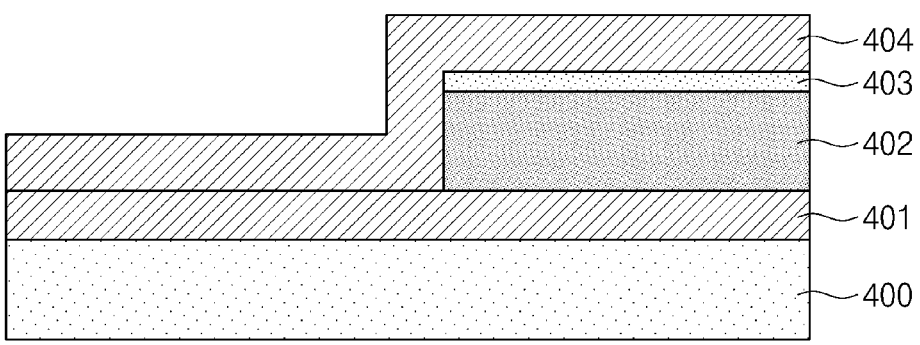

[FIG 52]
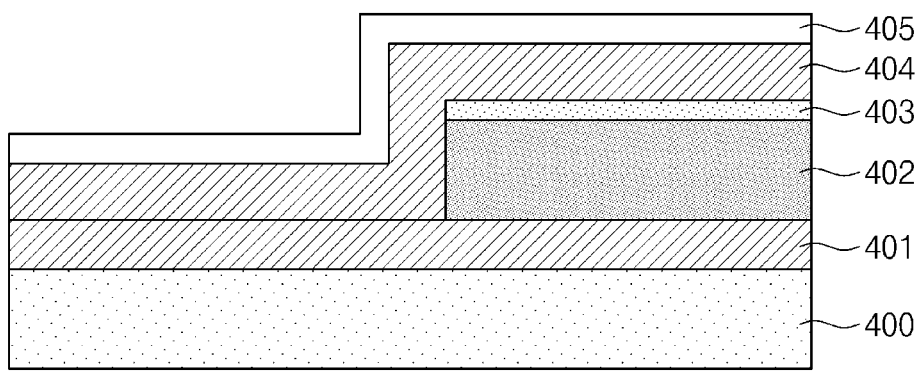
[FIG 53]
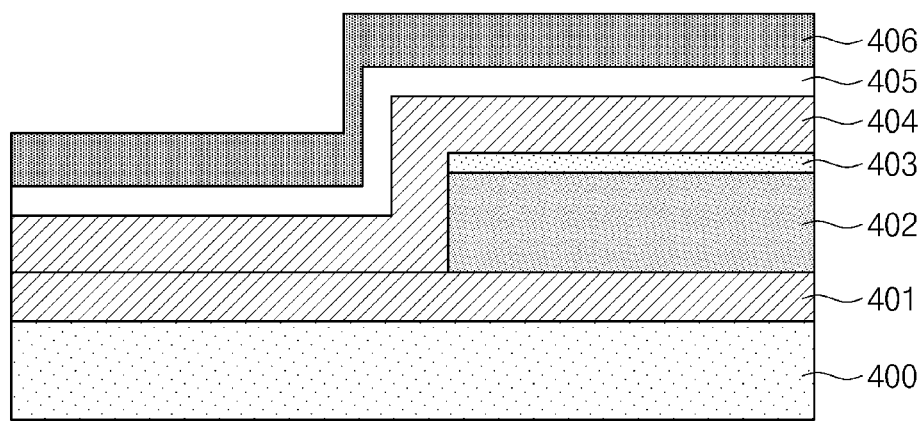

[FIG 54]
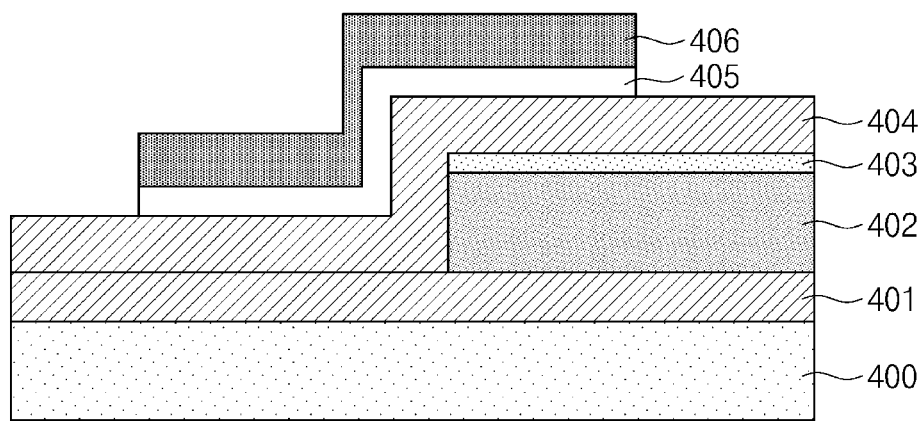
[FIG 55]
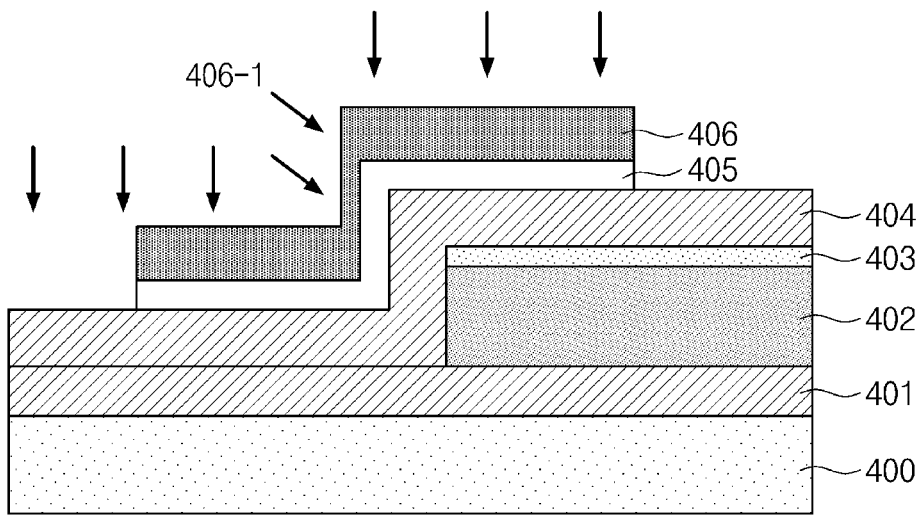

[FIG 56]
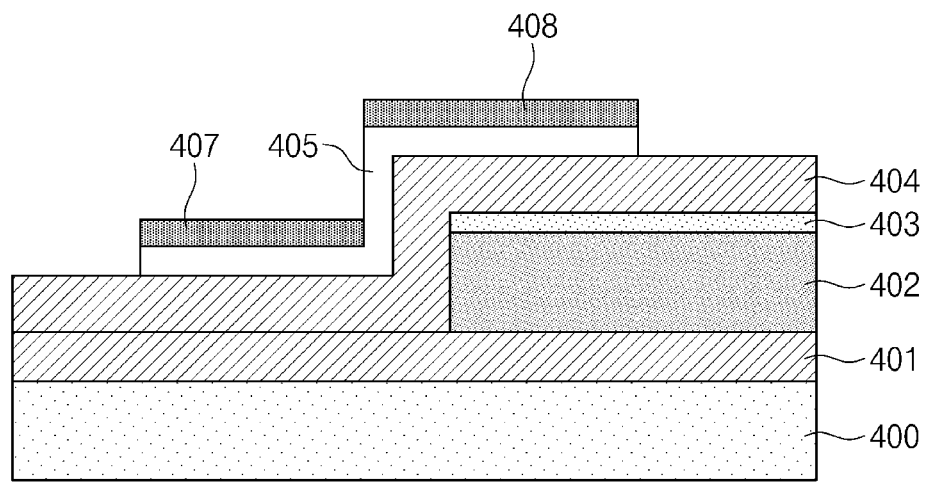
[FIG 57]
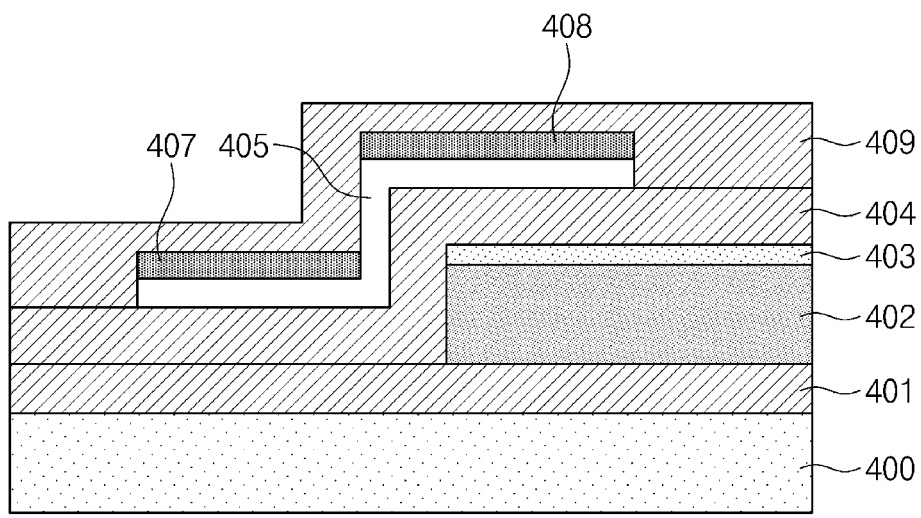

[FIG 58]
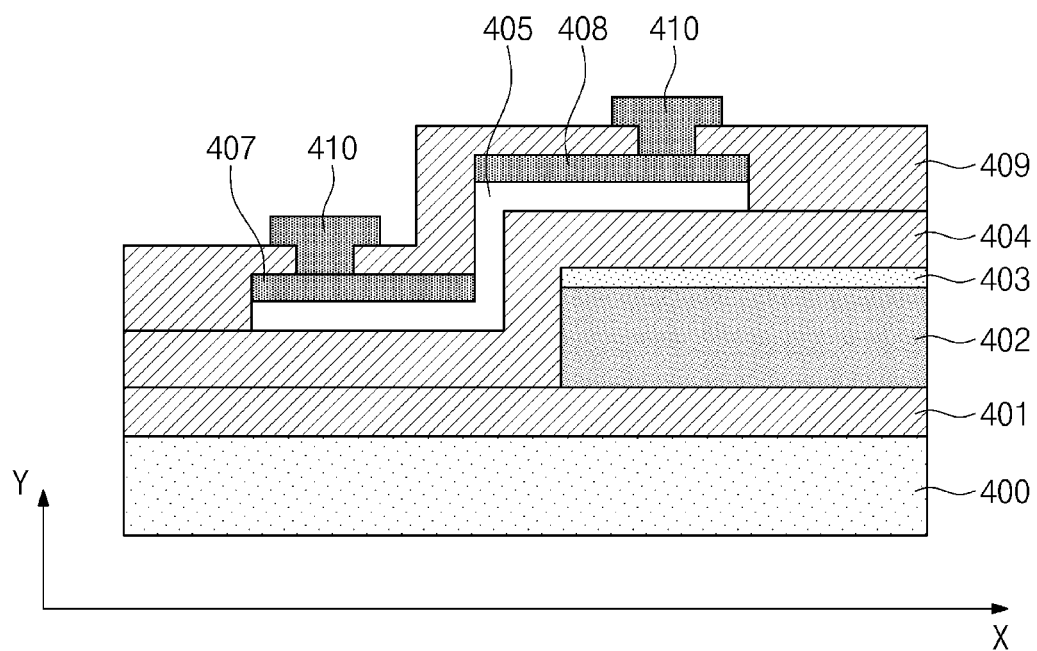

VERTICAL-STRUCTURE FIELD-EFFECT TRANSISTOR AND MANUFACTURING METHOD THEREFOR

TECHNICAL FIELD

The present invention relates to a vertical-structure field-effect transistor and a manufacturing method therefor, and more specifically, to a vertical-structure field-effect transistor for forming an electric field in a vertical direction as a height direction of a gate electrode, and a manufacturing method therefor.

BACKGROUND ART

Recently, various semiconductor devices require a technology for increasing the degree of integration by inserting more transistors in a limited area. Methods for a technology of forming a finer pattern to increase the degree of integration and laminating the devices in multiple layers have been developed and used in order to form smaller devises on a plane. In addition, a method of fabricating a device by using a vertical surface rather than a horizontal surface has been proposed.

The conventional vertical-structure field-effect transistor using a semiconductor thin film has a structure in which a vertical insulator is formed first, a channel is formed on a vertical surface of the insulator so as to be connected to a source electrode and a drain electrode, and a gate insulating layer and a gate electrode are formed thereafter. The transistor may be fabricated to have an active with a length adjusted according to a thickness of the vertical insulator, and have a very small active length of less than 1 micrometer.

However, because the length of the gate electrode is limited to limitations of the existing processes, and the length is at least a few micrometers or more, relatively large overlaps may occur between the gate electrode, the source electrode and the drain electrode. This may mainly cause problems of a parasitic capacitance and a leakage current. The parasitic capacitance refers to an undesired capacitance formed by a process cause, and may cause a problem of deteriorating performance of a designed circuit. For the leakage current, since the drain electrode and the gate electrode excessively overlap each other compared to the length of the channel, a potential of the drain electrode may affect an electric field effect of the gate electrode and prevent the active from maintaining an off-state, thereby causing the leakage current.

Accordingly, the inventors of the present invention have invented a vertical-structure field-effect transistor and a manufacturing method therefor to minimize the leakage current and the parasitic capacitance.

DISCLOSURE

Technical Problem

One technical problem to be solved by the present invention is to provide a vertical-structure field-effect transistor and a manufacturing method therefor to minimize a leakage current.

Another technical problem to be solved by the present invention is to provide a vertical-structure field-effect transistor and a manufacturing method therefor to minimize a parasitic capacitance.

Still another technical problem to be solved by the present invention is to provide a vertical-structure field-effect transistor and a manufacturing method therefor to minimize changes in conventional existing process.

The technical problems to be solved by the present invention are not limited to the above description.

Technical Solution

The vertical-structure field-effect transistor according to one embodiment of the present invention includes: a gate electrode formed on a substrate and having a horizontal plane extending in a plane direction and a vertical plane extending in a height direction; a gate insulating layer covering the gate electrode; a vertical channel formed on the gate insulating layer, in which a channel is formed in the height direction; a source electrode coming into contact with one end of the vertical channel; and a drain electrode coming into contact with an opposite end of the vertical channel and formed at a height level different from a height level of the source electrode, wherein a channel on-off state of the vertical channel is controlled by an electric field formed to the vertical channel in the vertical plane of the gate electrode, and at least one of the source electrode and the drain electrode may not overlap (non-overlap) the gate electrode in the height direction of the gate electrode.

According to one embodiment, the source electrode, the vertical channel, and the drain electrode may include semiconductor components identical to each other, and the source electrode and the drain electrode may further include ions for increasing electrical conductivity.

According to one embodiment, a hard film having an etching rate lower than an etching rate of the gate electrode may be further formed on the gate electrode.

According to one embodiment, the source electrode may be formed below one end of the vertical channel, and the drain electrode may be formed below an opposite end of the vertical channel.

According to one embodiment, the source electrode may be formed above one end of the vertical channel, and the drain electrode may be formed above an opposite end of the vertical channel.

The method for manufacturing the vertical-structure field-effect transistor according to the first embodiment of the present invention includes: preparing a substrate; forming a preliminary gate electrode layer on the substrate; forming a hard film having an etching rate lower than an etching rate of the gate electrode on the preliminary gate electrode layer; patterning the hard film; using the hard film as a mask and patterning the gate electrode to have a horizontal plane extending in a plane direction and a vertical plane extending in a height direction; forming a gate insulating layer; forming a semiconductor layer on the gate insulating layer, and patterning the formed semiconductor layer to have a horizontal portion extending in the plane direction and a vertical portion extending in the height direction; and forming one end of the horizontal portion as a source electrode and forming an opposite end of the horizontal portion as a drain electrode, by implanting ions having high electrical conductivity in the height direction.

According to the method for manufacturing the vertical-structure field-effect transistor according to the first embodiment of the present invention, at least one of the source electrode and the drain electrode may non-overlap the gate electrode in the height direction.

The method for manufacturing the vertical-structure field-effect transistor according to the second embodiment includes: preparing a substrate; forming a preliminary gate electrode layer on the substrate; forming a hard film having an etching rate lower than an etching rate of the gate electrode on the preliminary gate electrode layer; patterning the hard film; using the hard film as a mask and patterning the preliminary gate electrode layer to have a horizontal plane extending in a plane direction and a vertical plane extending in a height direction; forming a gate insulating layer; forming a preliminary electrode layer on the gate insulating layer, and first patterning the formed preliminary electrode layer to have a horizontal portion extending in the plane direction and a vertical portion extending in the height direction; performing a second patterning of selectively removing only the vertical portion of the horizontal portion and the vertical portion from the first patterned preliminary electrode layer, thereby forming source and drain electrodes; and forming a semiconductor layer on the source and drain electrodes, and patterning the formed semiconductor layer, thereby forming a vertical channel for connecting the source electrode and the drain electrode in the height direction.

According to the method for manufacturing the vertical-structure field-effect transistor according to the second embodiment, at least one of the source electrode and the drain electrode may non-overlap the gate electrode in the height direction.

According to the method for manufacturing the vertical-structure field-effect transistor according to the second embodiment, the vertical portion of the first patterning may have a thickness thinner than a thickness of the horizontal portion.

The method for manufacturing the vertical-structure field-effect transistor according to a third embodiment includes: preparing a substrate; forming a preliminary gate electrode layer on the substrate; forming a hard film having an etching rate lower than an etching rate of the gate electrode on the preliminary gate electrode layer; patterning the hard film; using the hard film as a mask and patterning the preliminary gate electrode layer as a gate electrode having a horizontal plane extending in a plane direction and a vertical plane extending in a height direction; forming a gate insulating layer; forming a semiconductor layer on the gate insulating layer, and continuously forming a preliminary electrode layer on the semiconductor layer; forming a vertical channel extending in the height direction by patterning the semiconductor layer with the same mask, and forming the preliminary electrode layer as an intermediate electrode layer having a vertical portion extending in the height direction and a horizontal portion extending in the plane direction; and forming source and drain electrodes by removing the vertical portion of the intermediate electrode layer.

According to the method for manufacturing the vertical-structure field-effect transistor according to a third embodiment, at least one of the source electrode and the drain electrode may non-overlap the gate electrode in the height direction.

According to the method for manufacturing the vertical-structure field-effect transistor according to a third embodiment, the vertical portion of the forming of the intermediate electrode layer may have a thickness thinner than a thickness of the horizontal portion.

Advantageous Effects

The vertical-structure field-effect transistor according to one embodiment of the present invention includes: a gate electrode formed on a substrate and having a horizontal plane extending in a plane direction and a vertical plane extending in a height direction; a gate insulating layer covering the gate electrode; a vertical channel formed on the gate insulating layer, in which a channel is formed in the height direction; a source electrode coming into contact with one end of the vertical channel; and a drain electrode coming into contact with an opposite end of the vertical channel, and formed at a height level different from a height level of the source electrode, wherein a channel on-off state of the vertical channel is controlled by an electric field formed to the vertical channel in the vertical plane of the gate electrode, and at least one of the source electrode and the drain electrode may not overlap (non-overlap) the gate electrode in the height direction of the gate electrode.

At least one of the source electrode and the drain electrode does not overlap (non-overlaps) the gate electrode in the height direction of the gate electrode, so that the parasitic capacitance and the leakage current can be minimized.

In addition, the transistor according to one embodiment has a vertical structure, so that miniaturization can be facilitated. In addition, since the channel is formed after the gate insulating layer is formed first, the process condition such as high process temperature for forming a high-quality gate insulating layer may be ensured, so that high reliability can be provided.

DESCRIPTION OF DRAWINGS

FIG. 1 is a view for explaining a vertical-structure field-effect transistor according to one embodiment of the present invention.

FIGS. 2 and 3 are flowcharts for explaining the manufacturing method of the vertical-structure field-effect transistor according to the first embodiment of the present invention.

FIGS. 4 to 20 are views for explaining in detail each step of method for manufacturing the vertical-structure field-effect transistor according to the first embodiment of the present invention.

FIGS. 21 and 22 are flowcharts for explaining the method for manufacturing the vertical-structure field-effect transistor according to a second embodiment of the present invention.

FIGS. 23 to 40 are views for explaining in detail each step of method for manufacturing the vertical-structure field-effect transistor according to a second embodiment of the present invention.

FIGS. 41 and 42 are flowcharts for explaining the method for manufacturing the vertical-structure field-effect transistor according to a third embodiment of the present invention.

FIGS. 43 to 58 are views for explaining in detail each step of method for manufacturing the vertical-structure field-effect transistor according to a third embodiment of the present invention.

BEST MODE

Mode for Invention

Hereinafter, exemplary embodiments of the present invention will be described in detail with reference to the accompanying drawings. However, the technical idea of the present invention is not limited to the exemplary embodiments described herein and may be embodied in other forms. Further, the embodiments are provided to enable contents disclosed herein to be thorough and complete and provided to enable those skilled in the art to fully understand the idea of the present invention.

In the specification herein, when one component is mentioned as being on the other component, it signifies that the one component may be placed directly on the other component or a third component may be interposed therebetween. In addition, in drawings, thicknesses of layers and areas may be exaggerated to effectively describe the technology of the present invention.

In addition, although terms such as first, second and third are used to describe various components in various embodiments of the present specification, the components will not be limited by the terms. The above terms are used merely to distinguish one component from another. Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it will be understood that the term such as "include" or "have" herein is intended to designate the presence of feature, number, step, component, or a combination thereof recited in the specification, and does not preclude the possibility of the presence or addition of one or more other features, numbers, steps, components, or combinations thereof. In addition, the term "connection" is used herein to include both indirectly connecting a plurality of components and directly connecting the components.

In addition, in the following description of the embodiments of the present invention, the detailed description of known functions and configurations incorporated herein will be omitted when it possibly makes the subject matter of the present invention unclear unnecessarily.

FIG. 1 is a view for explaining a vertical-structure field-effect transistor according to one embodiment of the present invention.

Referring to FIG. 1, a vertical-structure field-effect transistor 100 according to one embodiment of the present invention may include at least one of a substrate 100, a lower insulating film 101, a gate electrode 102, a gate insulating layer 103, a vertical channel 104, source/drain electrodes 105 and 106, and an upper insulating film 107. Hereinafter, each configuration will be described in detail.

The substrate 100 may be formed of at least one of glass and plastic-based materials. For example, in the case of plastic-based material, the substrate 100 may include at least one of polyimide (PI), polyethylene terephthalate (PET), polyethylene naphthalate (PEN), and polycarbonate (PC). When the substrate 100 is formed of the plastic-based material, it may have flexible properties. However, the substrate 100 may have flexible properties even when being formed of a glass-based material.

A lower insulating film 101 may be provided on the substrate 100. The lower insulating film 101 may include at least one of organic and inorganic materials. When the lower insulating film 101 is the inorganic material, the lower insulating film may be formed of a silicon nitride film (SiNx) or a silicon oxide film (SiOx), and the material of the lower insulating film 101 is not limited thereto. In addition, the lower insulating film 101 may be omitted.

The gate electrode 102 may be provided on the lower insulating film 101. The gate electrode 102 may be formed of at least one metal among copper (Cu), molybdenum (Mo), aluminum (Al), chromium (Cr), gold (Au), titanium (Ti), nickel (Ni), neodymium (Nd), tantalum (Ta) and tungsten (W), and may have a structure in which a single layer or a plurality of metals are laminated.

The gate insulating layer 103 may be provided on the gate electrode 102. The gate insulating layer 103 forms an electric field between the vertical channel 104 and the gate electrode 102 to be described later, but may function as an insulating film that blocks the flow of current.

The vertical channel 104 may be formed of at least one of materials, for example, amorphous silicon, single crystal silicon, and oxide semiconductor. For example, when the vertical channel 104 is formed of an oxide semiconductor, the vertical channel 104 may be formed of indium-galium-zinc oxide (IGZO). However, the vertical channel 104 is not limited to a specific oxide semiconductor.

The source and drain electrodes 105 and 106 may be energized via the vertical channel 104 as a current path. The source and drain electrodes 105 and 106 may be formed as a part of the vertical channel 104, and may be formed as a different layer from the vertical channel 104. Specific details of the source and drain electrodes 105 and 106 will be described to in the description of the first to third embodiments below.

The source and drain electrodes 105 and 106 may be formed as a single layer or multiple layers. In the case of single layer, it may be formed of at least one material or an alloy of molybdenum (Mo), aluminum (Al), chromium (Cr), gold (Au), titanium (Ti), nickel (Ni), neodymium (Nd) and copper (Cu). When the source and drain electrodes 105 and 106 are formed as multiple layers, the multiple layers may be formed as a double layer of molybdenum/aluminum-neodymium, molybdenum/aluminum, titanium/aluminum, or copper/molytitanium, or as a triple layer of molybdenum/aluminum-neodymium/molybdenum, molybdenum/aluminum/molybdenum, titanium/aluminum/titanium, or molytitanium/copper/molytitanium.

According to one embodiment, the source electrode 105 and the drain electrode 106 may be provided at different height levels, that is, different heights in the Y-axis direction of FIG. 1.

The upper insulating film 107 may be provided on the source and drain electrodes 105 and 106, and the upper insulating film 107 has a through-hole, so that a connection electrode 08 electrically connected to the source and drain electrodes 105 and 106 through the through-hole may be provided.

According to one embodiment of the present invention, the gate electrode 102 may have a horizontal plane extending in a plane direction (X-axis direction of FIG. 1) and a vertical plane extending in a height direction (Y-axis direction of FIG. 1).

The vertical channel 104 is electrically on/off controlled according to the electric field from the gate electrode 102, in which the direction of the electric field (E in FIG. 1) from the gate electrode 102 may be a plane direction of the gate electrode 102.

Accordingly, the direction (I in FIG. 1) of movement of the current in the vertical channel 104 may be in a height direction (Y-axis direction in FIG. 1), which is a plane direction of the vertical channel 104.

Further, according to one embodiment, at least one of the source electrode 105 and the drain electrode 106 may non-overlap the gate electrode 102. Referring to FIG. 1, the source electrode 105 may non-overlap the gate electrode 102 in the Y-axis direction of FIG. 1.

In other words, the vertical channel 104 allows a current to flow in the height direction of the vertical channel 104 (Y direction in FIG. 1), so that a space for allowing the source electrode 105 to non-overlap the gate electrode 102 may be provided.

Accordingly, at least one of the source and drain electrodes 105 and 106 non-overlaps the gate electrode 102, so that the parasitic capacitance and the leakage current can be minimized.

Since the vertical-structure field-effect transistor according to one embodiment of the present invention may be manufactured by various methods, the first to third embodiments will be described below with reference to FIGS. 2 to 58.

For the reference, when a reference numeral used during describing each manufacturing method is the same as the component in the previously described embodiments, it performs the corresponding function, and accordingly, the detailed description will be omitted.

FIGS. 2 and 3 are flowcharts for explaining the method for manufacturing the vertical-structure field-effect transistor according to the first embodiment of the present invention. FIGS. 4 to 20 are views for explaining each step in detail of the method for manufacturing the vertical-structure field-effect transistor according to the first embodiment of the present invention.

Referring to FIGS. 2 and 3, the vertical-structure field-effect transistor according to the first embodiment of the present invention may include at least one step of: preparing a substrate (S100), forming a preliminary gate electrode layer on the substrate (S102), forming a hard film having an etching rate lower than an etching rate of the gate electrode on the gate electrode (S104), patterning the hard film (S106), using the hard film as a mask and patterning the gate electrode to have a horizontal plane extending in a plane direction and a vertical plane extending in a height direction (S108), forming a gate insulating layer (S110), forming a semiconductor layer on the gate insulating layer, and patterning the formed semiconductor layer to have a horizontal portion extending in the plane direction and a vertical portion extending in the height direction (S112), forming one end of the horizontal portion as a source electrode and forming an opposite end of the horizontal portion as a drain electrode by implanting ions having high electrical conductivity in the height direction (S114), and forming a protective layer, forming a contact hole in the protective layer, and then forming a connection electrode in the contact hole (S116).

Hereinafter, each step will be described in detail.

S100

The substrate 200 may be prepared, and a lower insulating film 201 may be formed on the substrate 200 (see FIGS. 4 and 5).

S102 and S104

A preliminary gate electrode layer 202 and a hard film 203 may be formed on the lower insulating film 201 (see FIG. 6). When the gate electrode 202 is etched, for example, dry etched vertically (in the Y-axis direction of FIG. 1), the hard film 203 may function as a hard mask. The hard film 203 may include at least one of, for example, silicon nitride, silicon oxide, and aluminum oxide.

S106

The hard film 203 may be patterned. To this end, a photo resistor 203-1 may be formed on the hard film 203 (see FIG. 7). Thereafter, only the gate electrode-shaped part may be selectively removed through a photomask, so that the photoresist 203-1 remains (see FIG. 8). Thereafter, the hard film 203 may be patterned to correspond to the shape of the remaining photoresistor 203-1 (see FIG. 9). Thereafter, the remaining photoresistor 203-1 may be removed (see FIG. 10).

S108

The preliminary gate electrode layer 202 may be patterned as a gate electrode 202. The remaining hard film 203 may function as a mask. For example, the gate electrode 202 may be formed through an etching plasma 203-2 process (see FIG. 11). Since the hard film 203 on the gate electrode 202 has a very high etch selectivity rate, the vertical plane (the Y-axis direction of FIG. 1) of the gate electrode 202 may have an excellent shape profile.

S110

A gate insulating layer 204 may be formed.

The gate insulating layer 204 may be formed along the shape of the gate electrode 202 having the vertical plane (see FIG. 12).

S112

A vertical channel 205 may be formed.

To this end, a semiconductor layer 205 may be formed on the gate insulating layer 204 (see FIG. 13).

The semiconductor layer 205 may be patterned and formed as a vertical channel (see FIG. 14). The formed vertical channel 205 may have a vertical portion extending in the height direction and a horizontal portion extending in the plane direction. According to an embodiment of the present invention, the vertical portion may overlap the gate electrode in the plane direction (X-axis direction of FIG. 1).

S114

Source and drain electrodes may be formed.

To this end, an ion implantation 205-1 process may be performed in which ions are accelerated in the vertical direction (Y-axis direction of FIG. 1) with respect to the substrate in the horizontal portion of the vertical channel 205 (see FIG. 15). Accordingly, ions are implanted at a high density in the horizontal portion, thereby increasing the electrical conductivity, so that source and drain electrodes 207 may be formed (see FIG. 16). In this case, the source and drain electrodes 207 may be manufactured based on the semiconductor layer.

In addition, the ions are implanted in the vertical direction, so that the implantation of ions may be minimized in the vertical portion of the vertical channel 205. This is because the vertical portion of the vertical channel 205 may have the more vertical shape since the vertical plane profile of the gate electrode 20 is excellent. Accordingly, the vertical portion of the vertical channel 205 may maintain an intrinsic semiconductor characteristic.

S116

An upper insulating film 208 may be formed (see FIG. 17). Contact holes 206-1 and 207-1 for contact with the source and drain electrodes may be formed at one side of the upper insulating film 208 (see FIG. 18). Connection electrodes 209 may be formed to electrically come into contact with the source and drain electrodes 206 and 207 through the formed contact holes 206-1 and 207-1, respectively.

Through the above process, the vertical-structure field-effect transistor 200 according to the first embodiment may be manufactured (see FIG. 20).

Referring to FIG. 20, the vertical channel 205 may be formed accurately in the height direction (Y-axis direction of FIG. 20). Accordingly, the vertical channel 205 may still maintain the intrinsic semiconductor properties despite the ion implantation process for forming the source and drain electrodes 206 and 207. Further, as previously described with reference to FIG. 1, the at least one of the source and drain electrodes 206 and 207 non-overlaps the gate electrode 202 in the height direction (Y-axis direction of FIG. 20), so that the leakage current and the parasitic capacitance can be minimized.

Hereinafter, a vertical-structure field-effect transistor 300 according to a second embodiment of the present invention will be described with reference to FIGS. 21 to 40.

FIGS. 21 and 22 are flowcharts for explaining the method for manufacturing the vertical-structure field-effect transistor according to a second embodiment of the present invention. FIGS. 23 to 40 are views for explaining each step in detail of the method for manufacturing the vertical-structure field-effect transistor according to a second embodiment of the present invention.

Referring to FIGS. 21 and 22, the vertical-structure field-effect transistor according to a second embodiment of the present invention may include at least one step of: preparing a substrate (S200), forming a preliminary gate electrode layer on the substrate (S202), forming a hard film having an etching rate lower than an etching rate of the gate electrode on the preliminary gate electrode layer (S204), patterning the hard film (S206), using the hard film as a mask and patterning the preliminary gate electrode layer to have a horizontal plane extending in a plane direction and a vertical plane extending in a height direction (S208), forming a gate insulating layer (S210), forming a preliminary electrode layer on the gate insulating layer, and first patterning the formed preliminary electrode layer to have a horizontal portion extending in the plane direction and a vertical portion extending in the height direction (S212), performing a second patterning of selectively removing only the vertical portion of the horizontal portion and the vertical portion from the first patterned preliminary electrode layer, thereby forming source and drain electrodes (S214), forming a semiconductor layer on the source and drain electrodes and pattering the formed semiconductor layer, thereby forming a vertical channel for connecting the source electrode and the drain electrode in the height direction (S216), and forming a protective layer, forming a contact hole in the protective layer, and then forming a connection electrode in the contact hole (S218).

Hereinafter, each step will be described in detail. However, for convenience of description, the configuration repeated in the aforementioned manufacturing method according to the first embodiment will be omitted.

Steps S200, S202, S204, S206, S208, and S210

In step S200, a substrate 300 may be prepared (see FIG. 23), a lower insulating film 301 may be formed on the substrate (see FIG. 24), and a preliminary gate electrode layer 302 may be formed in step S202 and a hard film 303 may be laminated in step S204 (see FIG. 25). In step S206, a photoresistor 303-1 may be formed (see FIG. 26), the photoresistor 303-1 may be patterned (see FIG. 27), and a hard film 303 may be patterned (see FIG. 28). The patterned remaining photoresistor 303-1 may be removed (see FIG. 29). In step S208, the preliminary gate electrode layer 302 may be patterned as a gate electrode to have a vertical plane through an etching plasma 303-2 (see FIG. 30). In step S210, a gate insulating layer 304 may be formed (see FIG. 31).

Step S212

In step S212, a preliminary electrode layer 305 may be formed (see FIG. 32). The preliminary electrode layer may be formed using a sputtering or thermal evaporation scheme. Accordingly, since the preliminary electrode layer is formed in the height direction, the preliminary electrode layer 305 may be formed to be significantly thick in the plane direction parallel to the substrate, and may be formed to be significantly thin in a height direction perpendicular to the substrate.

Then, the first patterning may be performed so that the preliminary electrode layer 305 has a horizontal portion parallel to the substrate and a vertical portion perpendicular to the substrate by using a photomask process (see FIG. 33).

Step S214

In step S214, through the second patterning process, the vertical portion of the first patterned preliminary electrode layer 305 may be removed by using a plasma mode dry etching or wet etching process (305-1) with strong isotropic properties (see FIG. 34). Accordingly, the relatively thin vertical portion of the preliminary electrode layer 305 is removed, so that the source and drain electrodes 306 and 307 may be formed (see FIG. 35). For example, the source electrode 306 may be formed at a height level lower than a height level of the drain electrode 307.

Step S216

In step S216, a semiconductor layer 308 may be formed (see FIG. 36). The semiconductor layer 308 may be selectively etched using a photomask process (see FIG. 37). Accordingly, the semiconductor layer may be patterned as a vertical channel 308. According to the second embodiment, the vertical channel 308 is positioned on the source and drain electrodes 306 and 307.

Step S218

An upper insulating film 309 may be formed (see FIG. 38). Contact holes 309-1 for contact with the source and drain electrodes may be formed at one side of the upper insulating film 309 (see FIG. 39S). Connection electrodes 310 may be formed to electrically come into contact with the source and drain electrodes 306 and 307 through the formed contact holes 309-1, respectively.

Through the above process, the vertical-structure field-effect transistor 300 according to the second embodiment may be manufactured (see FIG. 40). As previously described with reference to FIG. 1, the at least one of the source and drain electrodes 306 and 307 non-overlaps the gate electrode 302 in the height direction (Y-axis direction of FIG. 40), so that the leakage current and the parasitic capacitance can be minimized.

Hereinafter, a vertical-structure field-effect transistor 300 according to a third embodiment of the present invention will be described with reference to FIGS. 41 to 58.

FIGS. 41 and 42 are flowcharts for explaining the method for manufacturing the vertical-structure field-effect transistor according to a third embodiment of the present invention. FIGS. 43 to 58 are views for explaining each step in detail of the method for manufacturing the vertical-structure field-effect transistor according to a third embodiment of the present invention.

Referring to FIGS. 41 and 42, the vertical-structure field-effect transistor 400 according to a third embodiment of the present invention may include at least one step of: preparing a substrate (S300), forming a preliminary gate electrode layer on the substrate (S302), forming a hard film having an etching rate lower than an etching rate of the gate electrode on the preliminary gate electrode layer (S304), patterning the hard film (S306), using the hard film as a mask and patterning the preliminary gate electrode layer to have a horizontal plane extending in a plane direction and a vertical plane extending in a height direction (S308), forming a gate insulating layer (S310), forming a semiconductor layer on the gate insulating layer, and continuously forming a preliminary electrode layer on the semiconductor layer (S312), forming a vertical channel extending in the height direction by patterning the semiconductor layer with the same mask, and forming the preliminary electrode layer as an intermediate electrode layer having a vertical portion extending in the height direction and a horizontal portion extending in the plane direction (S314), forming source and drain electrodes (S316) by removing the vertical portion of the intermediate electrode layer, and forming a protective layer, forming a contact hole in the protective layer, and then forming a connection electrode in the contact hole (S318).

Hereinafter, each step will be described in detail. However, for convenience of description, the configurations repeated in the aforementioned manufacturing methods according to the first and second embodiments will be omitted.

Steps S300, S302, S304, S306, S308, and S310

In step S300, a substrate 400 may be prepared (see FIG. 43), and a lower insulating film 401 may be formed on the substrate (see FIG. 44). In step S302, a preliminary gate electrode layer 320 may be formed, and in step S304, a hard film 403 may be laminated (see FIG. 45). In step S306, a photoresistor 403-1 may be formed (see FIG. 46), a photoresistor 403-1 may be patterned (see FIG. 47), and the hard film 403 may be patterned (see FIG. 47). The patterned remaining photoresistor 403-1 may be removed (see FIG. 48). In step S308, the preliminary gate electrode layer 402 may be patterned as a gate electrode to have a vertical plane through an etching plasma 403-2 (see FIG. 50). In step S310, a gate insulating layer 404 may be formed (see FIG. 51).

Step S312

A semiconductor layer 405 may be formed on the gate insulating layer 404 (see FIG. 52). A preliminary electrode layer 406 may be continuously formed on the semiconductor layer 405 (see FIG. 53). The preliminary electrode layer 406 may be formed by a sputtering process or a thermal evaporation process so that a thickness of the vertical portion is thinner than a thickness of the horizontal portion.

Step S314

The semiconductor layer 405 and the preliminary electrode layer 406 may be etched using the same mask (see FIG. 54). Accordingly, the semiconductor layer 405 may be patterned to have a vertical portion. In addition, the preliminary electrode layer 406 may also be patterned as an intermediate electrode layer to have a vertical portion.

Step S316

The vertical portion of the intermediate electrode layer 405 may be removed by using a plasma mode dry etching or wet etching process (406-1) with strong isotropic properties (see FIG. 55). This may signify that only the vertical portion can be selectively etched more smoothly because the thickness of the vertical portion of the intermediate electrode layer 405 formed in step S312 is thinner than that of the horizontal portion. Accordingly, source and drain electrodes 407 and 408 may be formed and the source and drain electrodes 407 and 408 may be formed on the vertical channel 405 (see FIG. 56).

Step S318

An upper insulating film 409 may be formed (see FIG. 57). Contact holes for contact with the source and drain electrodes may be formed at one side of the upper insulating film 409. Connection electrodes 410 may be formed to electrically come into contact with the source and drain electrodes 407 and 408 through the formed contact holes, respectively (see FIG. 58).

Through the above process, the vertical-structure field-effect transistor 300 according to the third embodiment may be manufactured (see FIG. 40). As previously described with reference to FIG. 1, the at least one of the source and drain electrodes 407 and 408 non-overlaps the gate electrode 402 in the height direction (Y-axis direction of FIG. 58), so that the leakage current and the parasitic capacitance can be minimized.

Although the present invention has been described in detail by using exemplary embodiments, the scope of the present invention is not limited to the specific embodiments, and shall be interpreted by the appended claims. In addition, it will be apparent that a person having ordinary skill in the art may carry out various deformations and modifications for the embodiments described as above within the scope without departing from the present invention.

The invention claimed is:

1. A vertical-structure field-effect transistor comprising:
a gate electrode formed on a substrate and having a horizontal plane extending in a plane direction and a vertical plane extending in a height direction;
a gate insulating layer covering the gate electrode;
a vertical channel formed on the gate insulating layer, in which a channel is formed in the height direction;
a source electrode coming into contact with one end of the vertical channel; and
a drain electrode coming into contact with an opposite end of the vertical channel, and formed at a height level different from a height level of the source electrode, wherein
a channel on-off state of the vertical channel is controlled by an electric field formed to the vertical channel in the vertical plane of the gate electrode, and
at least one of the source electrode and the drain electrode does not overlap (non-overlaps) the gate electrode in the height direction of the gate electrode,
wherein the vertical channel has a vertical portion extending in the height direction and a horizontal portion extending in the plane direction, and the vertical portion overlaps the gate electrode in the plane direction while not overlapping the gate electrode in the height direction,
wherein the horizontal portion includes an upper horizontal portion extending in the plane direction from the upper end of the vertical portion toward the gate electrode, and the upper horizontal portion is layered in the height direction with one of the source electrode and the drain electrode, and partially overlaps in the height direction with the gate electrode,
wherein the horizontal portion further includes a lower horizontal portion extending in the plane direction opposite to the upper horizontal portion from the lower end of the vertical portion, and the lower horizontal portion is layered in the height direction with the other one of the source electrode and the drain electrode, and does not overlap in the height direction with the gate electrode,
wherein the gate electrode is further formed thereon with a hard film having an etching rate lower than an etching rate of the gate electrode, and
wherein the hard film is used as a mask for forming the vertical plane of the gate electrode.

2. The vertical-structure field-effect transistor of claim 1, wherein the source electrode, the vertical channel, and the drain electrode include semiconductor components identical to each other, and the source electrode and the drain electrode further include ions for increasing electrical conductivity.

* * * * *